(12) United States Patent
Stockhammer et al.

(10) Patent No.: US 9,281,847 B2
(45) Date of Patent: Mar. 8, 2016

(54) MOBILE RECEPTION OF DIGITAL VIDEO BROADCASTING—TERRESTRIAL SERVICES

(75) Inventors: Thomas Stockhammer, Bergen (DE); David Gómez-Barquero, Cartagena (ES); David Gozalvez Serrano, Valencia (ES)

(73) Assignee: QUALCOMM Incorporated, San Diego, CA (US)

( * ) Notice: Subject to any disclaimer, the term of this patent is extended or adjusted under 35 U.S.C. 154(b) by 719 days.

(21) Appl. No.: 12/714,268

(22) Filed: Feb. 26, 2010

(65) Prior Publication Data

US 2010/0223533 A1   Sep. 2, 2010

Related U.S. Application Data

(60) Provisional application No. 61/156,431, filed on Feb. 27, 2009, provisional application No. 61/156,828, filed on Mar. 2, 2009.

(51) Int. Cl.
*H03M 13/05*   (2006.01)
*G06F 11/10*   (2006.01)
(Continued)

(52) U.S. Cl.
CPC ........ *H03M 13/3761* (2013.01); *H03M 13/373* (2013.01); *H04L 1/009* (2013.01);
(Continued)

(58) Field of Classification Search
CPC ..... H04L 1/0083; H04L 1/0043; H04L 1/009; H04L 1/0071; H04L 1/004; H04L 1/0057; H04L 1/0072; H03M 13/3761; H03M 13/373; H04N 21/4382; H04N 21/2383

USPC ................. 714/776, 751, 752, 712, 762, 786, 714/E11.032
See application file for complete search history.

(56) References Cited

U.S. PATENT DOCUMENTS

| | | | |
|---|---|---|---|
| 3,909,721 A | 9/1975 | Bussgang et al. | |
| 4,365,338 A | 12/1982 | McRae et al. | |

(Continued)

FOREIGN PATENT DOCUMENTS

| | | |
|---|---|---|
| CN | 1338839 A | 3/2002 |
| CN | 1425228 A | 6/2003 |

(Continued)

OTHER PUBLICATIONS

Bross, et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.

(Continued)

*Primary Examiner* — Phung M Chung

(57) ABSTRACT

A method of protecting data with application layer forward error correction in a communication system, wherein the communication system includes first devices with legacy receivers and second devices with FEC-enabled receivers, operation of the legacy receivers is not affected by the application layer forward error correction, and the method includes: determining a duration period; assembling packets of source data into source blocks corresponding to the duration period, each source block comprising a number of packets of source data; encoding the source blocks to generate encoded blocks, each encoded block comprising a number of packets of repair data; and transmitting the packets of repair data.

33 Claims, 7 Drawing Sheets

(51) Int. Cl.
*H03M 13/37* (2006.01)
*H04L 1/00* (2006.01)
*H04N 21/2383* (2011.01)
*H04N 21/438* (2011.01)

(52) U.S. Cl.
CPC ......... *H04L 1/0043* (2013.01); *H04L 1/0071* (2013.01); *H04N 21/2383* (2013.01); *H04N 21/4382* (2013.01); *H04L 2001/0093* (2013.01)

(56) References Cited

U.S. PATENT DOCUMENTS

| | | |
|---|---|---|
| 4,589,112 A | 5/1986 | Karim |
| 4,901,319 A | 2/1990 | Ross |
| 5,136,592 A | 8/1992 | Weng |
| 5,153,591 A | 10/1992 | Clark |
| 5,331,320 A | 7/1994 | Cideciyan et al. |
| 5,371,532 A | 12/1994 | Gelman et al. |
| 5,372,532 A | 12/1994 | Robertson, Jr. |
| 5,379,297 A | 1/1995 | Glover et al. |
| 5,421,031 A | 5/1995 | De Bey |
| 5,425,050 A | 6/1995 | Schreiber et al. |
| 5,432,787 A | 7/1995 | Chethik |
| 5,455,823 A | 10/1995 | Noreen et al. |
| 5,465,318 A | 11/1995 | Sejnoha |
| 5,517,508 A | 5/1996 | Scott |
| 5,524,025 A | 6/1996 | Lawrence et al. |
| 5,566,208 A | 10/1996 | Balakrishnan |
| 5,568,614 A | 10/1996 | Mendelson et al. |
| 5,583,784 A | 12/1996 | Kapust et al. |
| 5,608,738 A | 3/1997 | Matsushita |
| 5,617,541 A | 4/1997 | Albanese et al. |
| 5,642,365 A | 6/1997 | Murakami et al. |
| 5,659,614 A | 8/1997 | Bailey, III |
| 5,699,473 A | 12/1997 | Kim |
| 5,701,582 A | 12/1997 | DeBey |
| 5,751,336 A | 5/1998 | Aggarwal et al. |
| 5,754,563 A | 5/1998 | White |
| 5,757,415 A | 5/1998 | Asamizuya et al. |
| 5,802,394 A | 9/1998 | Baird et al. |
| 5,805,825 A | 9/1998 | Danneels et al. |
| 5,835,165 A | 11/1998 | Keate et al. |
| 5,844,636 A | 12/1998 | Joseph et al. |
| 5,870,412 A * | 2/1999 | Schuster et al. ............ 714/752 |
| 5,903,775 A | 5/1999 | Murray |
| 5,917,852 A | 6/1999 | Butterfield et al. |
| 5,926,205 A | 7/1999 | Krause et al. |
| 5,933,056 A | 8/1999 | Rothenberg |
| 5,936,659 A | 8/1999 | Viswanathan et al. |
| 5,936,949 A | 8/1999 | Pasternak et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,005,477 A | 12/1999 | Deck et al. |
| 6,011,590 A | 1/2000 | Saukkonen |
| 6,012,159 A | 1/2000 | Fischer et al. |
| 6,014,706 A | 1/2000 | Cannon et al. |
| 6,018,359 A | 1/2000 | Kermode et al. |
| 6,041,001 A | 3/2000 | Estakhri |
| 6,044,485 A | 3/2000 | Dent et al. |
| 6,061,820 A | 5/2000 | Nakakita et al. |
| 6,073,250 A | 6/2000 | Luby et al. |
| 6,079,041 A | 6/2000 | Kunisa et al. |
| 6,079,042 A | 6/2000 | Vaman et al. |
| 6,081,907 A | 6/2000 | Witty et al. |
| 6,081,909 A | 6/2000 | Luby et al. |
| 6,081,918 A | 6/2000 | Spielman |
| 6,088,330 A | 7/2000 | Bruck et al. |
| 6,097,320 A | 8/2000 | Kuki et al. |
| 6,134,596 A | 10/2000 | Bolosky et al. |
| 6,141,053 A | 10/2000 | Saukkonen |
| 6,141,787 A | 10/2000 | Kunisa et al. |
| 6,141,788 A | 10/2000 | Rosenberg et al. |
| 6,154,452 A | 11/2000 | Marko et al. |
| 6,163,870 A | 12/2000 | Luby et al. |
| 6,166,544 A | 12/2000 | Debbins et al. |
| 6,175,944 B1 | 1/2001 | Urbanke et al. |
| 6,178,536 B1 | 1/2001 | Sorkin |
| 6,185,265 B1 | 2/2001 | Campanella |
| 6,195,777 B1 | 2/2001 | Luby et al. |
| 6,223,324 B1 | 4/2001 | Sinha et al. |
| 6,226,259 B1 | 5/2001 | Piret |
| 6,226,301 B1 | 5/2001 | Cheng et al. |
| 6,229,824 B1 | 5/2001 | Marko |
| 6,243,846 B1 * | 6/2001 | Schuster et al. ............ 714/776 |
| 6,272,658 B1 | 8/2001 | Steele et al. |
| 6,278,716 B1 | 8/2001 | Rubenstein et al. |
| 6,298,462 B1 | 10/2001 | Yi |
| 6,307,487 B1 | 10/2001 | Luby |
| 6,314,289 B1 | 11/2001 | Eberlein et al. |
| 6,320,520 B1 | 11/2001 | Luby |
| 6,332,163 B1 | 12/2001 | Bowman-Amuah |
| 6,333,926 B1 | 12/2001 | Van Heeswyk et al. |
| 6,373,406 B2 | 4/2002 | Luby |
| 6,393,065 B1 | 5/2002 | Piret et al. |
| 6,411,223 B1 | 6/2002 | Haken et al. |
| 6,415,326 B1 | 7/2002 | Gupta et al. |
| 6,420,982 B1 | 7/2002 | Brown |
| 6,421,387 B1 | 7/2002 | Rhee |
| 6,430,233 B1 | 8/2002 | Dillon et al. |
| 6,445,717 B1 | 9/2002 | Gibson et al. |
| 6,459,811 B1 | 10/2002 | Hurst, Jr. |
| 6,466,698 B1 | 10/2002 | Creusere |
| 6,473,010 B1 | 10/2002 | Vityaev et al. |
| 6,486,803 B1 | 11/2002 | Luby et al. |
| 6,487,692 B1 | 11/2002 | Morelos-Zaragoza |
| 6,496,980 B1 | 12/2002 | Tillman et al. |
| 6,497,479 B1 | 12/2002 | Stoffel et al. |
| 6,510,177 B1 | 1/2003 | De Bonet et al. |
| 6,523,147 B1 | 2/2003 | Kroeger et al. |
| 6,535,920 B1 | 3/2003 | Parry et al. |
| 6,577,599 B1 | 6/2003 | Gupta et al. |
| 6,584,543 B2 | 6/2003 | Williams et al. |
| 6,609,223 B1 | 8/2003 | Wolfgang |
| 6,614,366 B2 | 9/2003 | Luby |
| 6,618,451 B1 | 9/2003 | Gonikberg |
| 6,631,172 B1 | 10/2003 | Shokrollahi et al. |
| 6,633,856 B2 | 10/2003 | Richardson et al. |
| 6,641,366 B2 | 11/2003 | Nordhoff |
| 6,643,332 B1 | 11/2003 | Morelos-Zaragoza et al. |
| 6,677,864 B2 | 1/2004 | Khayrallah |
| 6,678,855 B1 | 1/2004 | Gemmell |
| 6,694,476 B1 | 2/2004 | Sridharan et al. |
| 6,704,370 B1 | 3/2004 | Chheda et al. |
| 6,732,325 B1 | 5/2004 | Tash et al. |
| 6,742,154 B1 | 5/2004 | Barnard |
| 6,748,441 B1 | 6/2004 | Gemmell |
| 6,751,772 B1 | 6/2004 | Kim et al. |
| 6,765,866 B1 | 7/2004 | Wyatt |
| 6,804,202 B1 | 10/2004 | Hwang |
| 6,810,499 B2 | 10/2004 | Sridharan et al. |
| 6,820,221 B2 | 11/2004 | Fleming |
| 6,831,172 B1 | 12/2004 | Barbucci et al. |
| 6,849,803 B1 | 2/2005 | Gretz |
| 6,850,736 B2 | 2/2005 | McCune, Jr. |
| 6,856,263 B2 | 2/2005 | Shokrollahi et al. |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,895,547 B2 | 5/2005 | Eleftheriou et al. |
| 6,909,383 B2 | 6/2005 | Shokrollahi et al. |
| 6,928,603 B1 | 8/2005 | Castagna et al. |
| 6,937,618 B1 | 8/2005 | Noda et al. |
| 6,956,875 B2 | 10/2005 | Kapadia et al. |
| 6,965,636 B1 | 11/2005 | DesJardins et al. |
| 6,985,459 B2 | 1/2006 | Dickson |
| 6,995,692 B2 | 2/2006 | Yokota et al. |
| 7,010,052 B2 | 3/2006 | Dill et al. |
| 7,030,785 B2 | 4/2006 | Shokrollahi et al. |
| 7,031,257 B1 | 4/2006 | Lu et al. |
| 7,057,534 B2 | 6/2006 | Luby |
| 7,068,681 B2 | 6/2006 | Chang et al. |
| 7,068,729 B2 | 6/2006 | Shokrollahi et al. |

(56) References Cited

U.S. PATENT DOCUMENTS

| | | | |
|---|---|---|---|
| 7,072,971 B2 | 7/2006 | Lassen et al. |
| 7,073,191 B2 | 7/2006 | Srikantan et al. |
| 7,100,188 B2 | 8/2006 | Hejna, Jr. |
| 7,110,412 B2 | 9/2006 | Costa et al. |
| 7,113,773 B2 | 9/2006 | Quick, Jr. et al. |
| 7,139,660 B2 | 11/2006 | Sarkar et al. |
| 7,139,960 B2 | 11/2006 | Shokrollahi et al. |
| 7,143,433 B1 | 11/2006 | Duan et al. |
| 7,151,754 B1 | 12/2006 | Boyce et al. |
| 7,154,951 B2 | 12/2006 | Wang |
| 7,164,370 B1 | 1/2007 | Mishra |
| 7,164,882 B2 | 1/2007 | Poltorak |
| 7,168,030 B2 | 1/2007 | Ariyoshi |
| 7,219,289 B2 | 5/2007 | Dickson |
| 7,233,264 B2 | 6/2007 | Luby |
| 7,240,236 B2 | 7/2007 | Cutts et al. |
| 7,240,358 B2 | 7/2007 | Horn et al. |
| 7,243,285 B2 | 7/2007 | Foisy et al. |
| 7,249,291 B2 | 7/2007 | Rasmussen et al. |
| 7,254,754 B2 | 8/2007 | Hetzler et al. |
| 7,257,764 B2 | 8/2007 | Suzuki et al. |
| 7,265,688 B2 | 9/2007 | Shokrollahi et al. |
| 7,293,222 B2 | 11/2007 | Shokrollahi et al. |
| 7,295,573 B2 | 11/2007 | Yi et al. |
| 7,304,990 B2 | 12/2007 | Rajwan |
| 7,318,180 B2 | 1/2008 | Starr |
| 7,320,099 B2 | 1/2008 | Miura et al. |
| 7,363,048 B2 | 4/2008 | Cheng et al. |
| 7,391,717 B2 | 6/2008 | Klemets et al. |
| 7,394,407 B2 | 7/2008 | Shokrollahi et al. |
| 7,398,454 B2 | 7/2008 | Cai et al. |
| 7,409,626 B1 | 8/2008 | Schelstraete |
| 7,412,641 B2 | 8/2008 | Shokrollahi et al. |
| 7,418,651 B2 | 8/2008 | Luby et al. |
| 7,451,377 B2 | 11/2008 | Shokrollahi |
| 7,483,447 B2 | 1/2009 | Chang et al. |
| 7,483,489 B2 | 1/2009 | Gentric et al. |
| 7,512,697 B2 | 3/2009 | Lassen et al. |
| 7,525,994 B2 | 4/2009 | Scholte |
| 7,529,806 B1 | 5/2009 | Shteyn |
| 7,532,132 B2 | 5/2009 | Shokrollahi et al. |
| 7,555,006 B2 | 6/2009 | Wolfe et al. |
| 7,559,004 B1 | 7/2009 | Chang et al. |
| 7,570,665 B2 | 8/2009 | Ertel et al. |
| 7,574,706 B2 | 8/2009 | Meulemans et al. |
| 7,590,118 B2 | 9/2009 | Giesberts et al. |
| 7,597,423 B2 | 10/2009 | Silverbrook |
| 7,613,183 B1 | 11/2009 | Brewer et al. |
| 7,633,413 B2 * | 12/2009 | Shokrollahi et al. ............ 341/52 |
| 7,633,970 B2 | 12/2009 | van Kampen et al. |
| 7,644,335 B2 | 1/2010 | Luby et al. |
| 7,650,036 B2 | 1/2010 | Lei et al. |
| 7,668,198 B2 | 2/2010 | Yi et al. |
| 7,676,735 B2 | 3/2010 | Luby et al. |
| 7,711,068 B2 | 5/2010 | Shokrollahi et al. |
| 7,720,096 B2 | 5/2010 | Klemets |
| 7,720,174 B2 | 5/2010 | Shokrollahi et al. |
| 7,721,184 B2 | 5/2010 | Luby et al. |
| 7,812,743 B2 | 10/2010 | Luby |
| 7,831,896 B2 | 11/2010 | Amram et al. |
| 7,853,856 B2 * | 12/2010 | Vedantham et al. .......... 714/776 |
| 7,924,913 B2 | 4/2011 | Sullivan et al. |
| 7,956,772 B2 * | 6/2011 | Shokrollahi et al. ............ 341/51 |
| 7,961,700 B2 | 6/2011 | Malladi et al. |
| 7,971,129 B2 | 6/2011 | Watson et al. |
| 7,979,769 B2 | 7/2011 | Lee et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| 8,239,727 B2 * | 8/2012 | Gao .............................. 714/755 |
| RE43,741 E | 10/2012 | Shokrollahi et al. |
| 8,301,725 B2 | 10/2012 | Biderman et al. |
| 8,327,403 B1 | 12/2012 | Chilvers et al. |
| 8,331,445 B2 | 12/2012 | Garudadri et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,812,735 B2 | 8/2014 | Igarashi |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0053062 A1 | 5/2002 | Szymanski |
| 2002/0083345 A1 | 6/2002 | Halliday et al. |
| 2002/0085013 A1 | 7/2002 | Lippincott |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0037299 A1 | 2/2003 | Smith |
| 2003/0086515 A1 | 5/2003 | Trans et al. |
| 2003/0101408 A1 | 5/2003 | Martinian et al. |
| 2003/0106014 A1 | 6/2003 | Dohmen et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0081106 A1 | 4/2004 | Bruhn |
| 2004/0096110 A1 | 5/2004 | Yogeshwar et al. |
| 2004/0117716 A1 | 6/2004 | Shen |
| 2004/0151109 A1 | 8/2004 | Batra et al. |
| 2004/0153468 A1 * | 8/2004 | Paila et al. .................... 707/101 |
| 2004/0162071 A1 | 8/2004 | Grilli et al. |
| 2004/0207548 A1 | 10/2004 | Kilbank |
| 2004/0240382 A1 | 12/2004 | Ido et al. |
| 2004/0255328 A1 | 12/2004 | Baldwin et al. |
| 2005/0018635 A1 | 1/2005 | Proctor, Jr. |
| 2005/0028067 A1 | 2/2005 | Weirauch |
| 2005/0071491 A1 | 3/2005 | Seo |
| 2005/0091697 A1 | 4/2005 | Tanaka et al. |
| 2005/0097213 A1 | 5/2005 | Barrett et al. |
| 2005/0105371 A1 | 5/2005 | Johnson et al. |
| 2005/0123058 A1 | 6/2005 | Greenbaum et al. |
| 2005/0138286 A1 | 6/2005 | Franklin et al. |
| 2005/0160272 A1 | 7/2005 | Teppler |
| 2005/0163468 A1 | 7/2005 | Takahashi et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0207392 A1 | 9/2005 | Sivalingham et al. |
| 2005/0216472 A1 | 9/2005 | Leon et al. |
| 2005/0216951 A1 | 9/2005 | MacInnis |
| 2005/0254575 A1 | 11/2005 | Hannuksela et al. |
| 2006/0015568 A1 | 1/2006 | Walsh et al. |
| 2006/0020796 A1 | 1/2006 | Aura et al. |
| 2006/0031738 A1 | 2/2006 | Fay et al. |
| 2006/0037057 A1 | 2/2006 | Xu |
| 2006/0093634 A1 | 5/2006 | Lutz et al. |
| 2006/0107174 A1 | 5/2006 | Heise |
| 2006/0109805 A1 | 5/2006 | Malamal Vadakital et al. |
| 2006/0120464 A1 | 6/2006 | Hannuksela |
| 2006/0212444 A1 | 9/2006 | Handman et al. |
| 2006/0212782 A1 | 9/2006 | Li |
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |

(56) References Cited

U.S. PATENT DOCUMENTS

| | | |
|---|---|---|
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0110074 A1 | 5/2007 | Bradley et al. |
| 2007/0140369 A1 | 6/2007 | Limberg et al. |
| 2007/0162568 A1 | 7/2007 | Gupta et al. |
| 2007/0162611 A1 | 7/2007 | Yu et al. |
| 2007/0176800 A1 | 8/2007 | Rijavec |
| 2007/0177811 A1 | 8/2007 | Yang et al. |
| 2007/0185973 A1 | 8/2007 | Wayda et al. |
| 2007/0195894 A1 | 8/2007 | Shokrollahi et al. |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | O'Rourke et al. |
| 2007/0255844 A1 | 11/2007 | Shen et al. |
| 2007/0277209 A1 | 11/2007 | Yousef |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1* | 3/2009 | Chen et al. ................ 375/340 |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1* | 1/2010 | Stockhammer et al. ...... 714/752 |
| 2010/0020871 A1 | 1/2010 | Hannuksela et al. |
| 2010/0023525 A1 | 1/2010 | Westerlund et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0131671 A1 | 5/2010 | Kohli et al. |
| 2010/0153578 A1 | 6/2010 | Van Gassel et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby |
| 2013/0287023 A1 | 10/2013 | Bims |
| 2014/0009578 A1 | 1/2014 | Chen et al. |
| 2014/0380113 A1 | 12/2014 | Luby |

FOREIGN PATENT DOCUMENTS

| | | |
|---|---|---|
| CN | 1481643 A | 3/2004 |
| CN | 1708934 A | 12/2005 |
| CN | 1714577 A | 12/2005 |
| CN | 1806392 A | 7/2006 |
| CN | 1819661 A | 8/2006 |
| CN | 101390399 A | 3/2009 |
| CN | 101729857 A | 6/2010 |
| EP | 0669587 A2 | 8/1995 |
| EP | 0701371 A1 | 3/1996 |
| EP | 0784401 A2 | 7/1997 |
| EP | 0853433 A1 | 7/1998 |
| EP | 0854650 A2 | 7/1998 |
| EP | 0903955 A1 | 3/1999 |
| EP | 0986908 A1 | 3/2000 |

(56) References Cited

FOREIGN PATENT DOCUMENTS

| | | |
|---|---|---|
| EP | 1051027 A1 | 11/2000 |
| EP | 1124344 A1 | 8/2001 |
| EP | 1241795 A2 | 9/2002 |
| EP | 1298931 A2 | 4/2003 |
| EP | 1406452 A2 | 4/2004 |
| EP | 1455504 A2 | 9/2004 |
| EP | 1670256 A2 | 6/2006 |
| EP | 1755248 A1 | 2/2007 |
| EP | 2071827 A2 | 6/2009 |
| EP | 1700410 B1 | 4/2010 |
| EP | 1665539 | 4/2013 |
| JP | H07183873 | 7/1995 |
| JP | 08186570 | 7/1996 |
| JP | 8289255 A | 11/1996 |
| JP | 9252253 A | 9/1997 |
| JP | 11041211 A | 2/1999 |
| JP | 11112479 | 4/1999 |
| JP | 11164270 A | 6/1999 |
| JP | 2000151426 A | 5/2000 |
| JP | 2000216835 A | 8/2000 |
| JP | 2000513164 A | 10/2000 |
| JP | 2000307435 A | 11/2000 |
| JP | 2000353969 A | 12/2000 |
| JP | 2001036417 | 2/2001 |
| JP | 2001094625 | 4/2001 |
| JP | 2001223655 A | 8/2001 |
| JP | 2001251287 A | 9/2001 |
| JP | 2001274776 A | 10/2001 |
| JP | 2001274855 A | 10/2001 |
| JP | 2002073625 A | 3/2002 |
| JP | 2002204219 A | 7/2002 |
| JP | 2002543705 A | 12/2002 |
| JP | 2003507985 | 2/2003 |
| JP | 2003092564 A | 3/2003 |
| JP | 2003510734 A | 3/2003 |
| JP | 2003174489 | 6/2003 |
| JP | 2003256321 A | 9/2003 |
| JP | 2003318975 A | 11/2003 |
| JP | 2003319012 | 11/2003 |
| JP | 2003333577 A | 11/2003 |
| JP | 2004048704 A | 2/2004 |
| JP | 2004070712 A | 3/2004 |
| JP | 2004135013 A | 4/2004 |
| JP | 2004165922 A | 6/2004 |
| JP | 2004516717 A | 6/2004 |
| JP | 2004192140 A | 7/2004 |
| JP | 2004193992 A | 7/2004 |
| JP | 2004529533 A | 9/2004 |
| JP | 2004289621 A | 10/2004 |
| JP | 2004343701 A | 12/2004 |
| JP | 2004348824 A | 12/2004 |
| JP | 2004362099 A | 12/2004 |
| JP | 2005094140 A | 4/2005 |
| JP | 2005136546 A | 5/2005 |
| JP | 2005204170 A | 7/2005 |
| JP | 2005223433 A | 8/2005 |
| JP | 2005277950 A | 10/2005 |
| JP | 2006503463 A | 1/2006 |
| JP | 2006505177 A | 2/2006 |
| JP | 2006506926 A | 2/2006 |
| JP | 2006074335 A | 3/2006 |
| JP | 2006074421 A | 3/2006 |
| JP | 2006115104 A | 4/2006 |
| JP | 2006174032 A | 6/2006 |
| JP | 2006174045 A | 6/2006 |
| JP | 2006186419 A | 7/2006 |
| JP | 2006519517 A | 8/2006 |
| JP | 2006287422 A | 10/2006 |
| JP | 2006319743 A | 11/2006 |
| JP | 2007013675 A | 1/2007 |
| JP | 2007089137 A | 4/2007 |
| JP | 2007158592 A | 6/2007 |
| JP | 2007174170 A | 7/2007 |
| JP | 2007520961 A | 7/2007 |
| JP | 2007228205 A | 9/2007 |
| JP | 2008011404 A | 1/2008 |
| JP | 2008016907 A | 1/2008 |
| JP | 2008508761 A | 3/2008 |
| JP | 2008508762 A | 3/2008 |
| JP | 2008283232 A | 11/2008 |
| JP | 2008283571 A | 11/2008 |
| JP | 2008543142 A | 11/2008 |
| JP | 2009027598 A | 2/2009 |
| JP | 2009522921 A | 6/2009 |
| JP | 2009522922 A | 6/2009 |
| JP | 2009171558 A | 7/2009 |
| JP | 2009527949 A | 7/2009 |
| JP | 2009277182 A | 11/2009 |
| JP | 2009544991 A | 12/2009 |
| JP | 2010539832 A | 12/2010 |
| JP | 2011087103 A | 4/2011 |
| KR | 1020030071815 | 9/2003 |
| KR | 1020030074386 A | 9/2003 |
| KR | 20040107152 A | 12/2004 |
| KR | 20040107401 A | 12/2004 |
| KR | 20050009376 A | 1/2005 |
| KR | 100809086 B1 | 3/2008 |
| KR | 20080083299 A | 9/2008 |
| KR | 20090098919 A | 9/2009 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | I246841 B | 1/2006 |
| TW | I354908 | 12/2011 |
| TW | I355168 | 12/2011 |
| WO | WO-9634463 A1 | 10/1996 |
| WO | WO-9750183 A1 | 12/1997 |
| WO | WO-9804973 A1 | 2/1998 |
| WO | WO-9832256 A1 | 7/1998 |
| WO | 0014921 A1 | 3/2000 |
| WO | 0052600 A1 | 9/2000 |
| WO | 0157667 A1 | 8/2001 |
| WO | 0158130 A2 | 8/2001 |
| WO | 0158131 A2 | 8/2001 |
| WO | 0227988 A2 | 4/2002 |
| WO | 02063461 A1 | 8/2002 |
| WO | WO 03046742 A1 | 6/2003 |
| WO | WO-03105484 A1 | 12/2003 |
| WO | 2004015948 A1 | 2/2004 |
| WO | 2004019521 A1 | 3/2004 |
| WO | 2004030273 A1 | 4/2004 |
| WO | WO-2004036824 A1 | 4/2004 |
| WO | 2004040831 A1 | 5/2004 |
| WO | 2004047455 A1 | 6/2004 |
| WO | WO-2004047019 A2 | 6/2004 |
| WO | WO-2004088988 A1 | 10/2004 |
| WO | WO-2004109538 A1 | 12/2004 |
| WO | 2005041421 A1 | 5/2005 |
| WO | 2005078982 A1 | 8/2005 |
| WO | WO-2005107123 | 11/2005 |
| WO | WO-2006013459 A1 | 2/2006 |
| WO | WO-2006036276 | 4/2006 |
| WO | 2006060036 A1 | 6/2006 |
| WO | WO-2006057938 A2 | 6/2006 |
| WO | WO-2006084503 A1 | 8/2006 |
| WO | WO-2006116102 A2 | 11/2006 |
| WO | WO-2006135878 A2 | 12/2006 |
| WO | 2007078253 A1 | 7/2007 |
| WO | 2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A2 | 4/2008 |
| WO | 2008054100 A1 | 5/2008 |
| WO | 2008086313 A1 | 7/2008 |
| WO | WO-2008085013 A1 | 7/2008 |
| WO | WO-2008131023 A1 | 10/2008 |
| WO | 2008144004 A1 | 11/2008 |
| WO | WO-2009065526 A1 | 5/2009 |
| WO | WO-2009137705 A2 | 11/2009 |

(56) References Cited

FOREIGN PATENT DOCUMENTS

| WO | 2009143741 A1 | 12/2009 |
|---|---|---|
| WO | WO-2010085361 A2 | 7/2010 |
| WO | WO-2011038013 | 3/2011 |
| WO | WO-2011038034 A1 | 3/2011 |
| WO | 2011059286 A2 | 5/2011 |
| WO | WO-2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

Bross, et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.
Gil A., et al., "Personalized Multimedia Touristic Services for Hybrid Broadcast/Broadband Mobile Receivers," IEEE Transactions on Consumer Electronics, 2010, vol. 56 (1), pp. 211-219.
ITU-T H 264, Series H: Audiovisual and Multimedia Systems, Infrastructure of audiovisual services—Coding of moving video, Advanced video coding for generic audiovisual services, The International Telcommunication Union. Jun. 2011, 674 pp.
Li, M., et al., "Playout Buffer and Rate Optimization for Streaming over IEEE 802.11 Wireless Networks", Aug. 2009, Worcester Polytechnic Institute, USA.
Michael G et al., "Improved low-density parity-check codes using irregular graphs", Information Theory, IEEE Transactions on, Feb. 2001, vol. 47, No. 2, pp. 585-598.
Roumy A., et al., "Unequal Erasure Protection and Object Bundle Protection with the Generalized Object Encoding Approach", Inria-00612583, Version 1, Jul. 29, 2011, 25pages.
Schulzrinne, et al., "Real Time Streaming Protocol (RTSP)" Network Working Group, Request for Comments: 2326, Apr. 1998, pp. 1-92.
Stockhammer T., et al., "DASH: Improvements on Representation Access Points and related flags", 97. MPEG Meeting; Jul 18, 2011-Jul. 22, 2011; Torino; (Motion Picture Expert Group or ISO/IEC JTC1/SC29/WG11) No. m20339, Jul. 24, 2011, XP030048903.
Wiegand, T., et al., "WD2: Working Draft 2 of High-Efficiency Video Coding", 20110128, No. JCTVC-D503, Jan. 28, 2011, XP002679642, Retrieved from the Internet: URL: http://wftp3.itu.int/av-arch/jctvc-site/2011_01_D_Daegu/ [retrieved on Jul. 11, 2012].
Wiegand, T., et al., "WD3: Working Draft 3 of High-Efficiency Video Coding," Document JCTVC-E603, 5th Meeting: Geneva, CH, Mar. 16-23, 2011, pp. 193.
Wiegand, T., et al.,"WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.
Yamanouchi N., et al., "Internet Multimedia Transmission with Packet Recovery by Using Forward Error Correction," Proceedings of DPS Workshop, The Information Processing Society of Japan, Dec. 6, 2000, vol. 2000, No. 15, pp. 145-150.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/etsi_ts/126300_126399/126346/06.01.00_60/ts_126346v060100p.pdf.
3rd Generation Partnership Project; Technical Specification Group Services and System Aspects; Transparent end-to-end Packet-switched Streaming Service (PSS); Progressive Download and Dynamic Adaptive Streaming over HTTP 3GPP Standard TS 26.247, 3rd Generation Partnership Project (GPP), Mobile Competence Centre; 650, Route Des Lucioles; F-06921 Sophia-Antipolis Cedex; France, vol. SA WG4, No. V10.0.0, Jun. 17, 2011, pp. 1-94, XP050553206, [retrieved on Jun. 17, 2011].
Atis: "PTV Content on Demand Service", IIF-WT-063R44, Nov. 11, 2010, pp. 1-124, XP055045168, Retrieved from the Internet: URL:ftp://vqeg.its.bldrdoc.gov/Documents/VQEG_Atlanta_Nov10/MeetingFiles/Liaison/IIF-WT-063R44_Content_on_Demand.pdf [retrieved on Nov. 22, 2012].
Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7TH Meeting: Geneva, CH, Nov. 21-30, 2011, pp. 259.
Bross, et al., "High efficiency video coding (HEVC) text specification draft 7," Joint Collaborative Team on Video Coding (JCT-VC) of ITU-T SG16 WP3 AND ISO/IEC JTC1/SC29/WG11 9th Meeting: Geneva, CH, Apr. 27- May 7, 2012, JCTVC-I1003_d2, 290 pp.
Bross, et al., "High efficiency video coding (HEVC) text specification draft 8," Joint Collaborative Team on Video Coding (JCT-VC) of ITU-T SG16 WP3 AND ISO/IEC JTC1/SC29/WG11 10th Meeting: Stockholm, SE, Jul. 11-20, 2012, JCTVC-J1003_d2, pp. 261.
"Digital Video Broadcasting (DVB); Framing structure, channel coding and modulation for digital terrestrial television; ETSI EN 300 744" ETSI Standards, Lis, Sophia Antiopolis Cedex, France, V1.6.1, pp. 9, Jan. 10, 2009 (2009-01).
Goyal: "Multiple Description Coding: Compression Meets the Network," In Signal Processing Magazine, IEEE, vol. 18., Issue 5 (Sep. 2001) pp. 74-93 URL: http://www.rie.mit.edu/stir/documents/Goyal_SigProcMag2001_MD.pdf [Nov. 4, 2007].
Jiang J., "File Format for Scalable Video Coding", PowerPoint Presentation for CMPT 820, Summer 2008.
Kim J., et al., "Enhanced Adaptive Modulation and Coding Schemes Based on Multiple Channel Reportings for Wireless Multicast Systems", 62nd IEEE Vehicular Technology Conference, VTC-2005-FALL, Sep. 25-28, 2005, vol. 2, pp. 725-729, XP010878578, DOI: 1 0.11 09/VETECF.2005.1558019, ISBN: 978-0/7803-9152-9.
Motorola et al: "An Analysis of DCD Channel Mapping to BCAST File Delivery Sessions; Oma-Cd-Dcd-2007-0112-INP_DCD_Channel_Mapping_to BCAST_File_Delivery", OMA-CD-DCD-2007-0112-INP_DCD_Channel Mapping_To_BCAST_File_Delivery, Open Mobile Alliance (OMA), 4330 La Jolla Village Dr., Suite 110 San Diego, Ca 92122; USA Oct. 2, 2007, pp. 1-13, XP064036903.
3GPP TS 26.234 V9.1.0 ,"3rd Generation Partnership Project; Technical Specification Group Services and System Aspects; Transparent end-to-end Packet-switched Streaming Service (PSS); Protocols and codecs (Release 9) ", Dec. 2009, 179 pages.
3GPP Ts 26.244 V9.1.0, 3rd Generation Partnership Project; Technical Specification Group Services and System Aspects; Transparent end-to-end packet-switched streaming service (PSS); 3GPP file format (3GP), (Release 9), Mar. 2010, 55 pp.
3GPP TS 26.247 v1.5.0 , 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010, 91 pages.
3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010, pp. 1-55, XP050441544, [retrieved on Jun. 9, 2010].
Aggarwal, C. et al.: "A Permutation-Based Pyramid Broadcasting Scheme for Video-on Demand Systems," Proc. IEEE Int'l Conf. on Multimedia Systems, Hiroshima, Japan (Jun. 1996).
Aggarwal, C. et al.: "On Optimal Batching Policies for Video-on-Demand Storage Servers," Multimedia Systems, vol. 4, No. 4, pp. 253-258 (1996).
Albanese, A., et al., "Priority Encoding Transmission", IEEE Transactions on Information Theory, vol. 42, No. 6, pp. 1-22, (Nov. 1996).
Alex Zambelli,"IIS Smooth Streaming Technical Overview", Microsoft Mar. 25, 2009, XP002620446, Retrieved from the Internet: URL:http://www.microsoft.com/downloads/en/ details.aspx''FamilyID=03d22583-3ed6-44da-8464-b1b4b5ca7520, [retrieved on Jan. 21, 2011].

(56) References Cited

OTHER PUBLICATIONS

Almeroth, et al., "The use of multicast delivery to provide a scalable and interactive video-on-demand service", IEEE Journal on Selected Areas in Communication, 14(6): 1110-1122, (1996).
Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.
Amin Shokrollahi: "LDPC Codes: An Introduction" Internet Citation Apr. 2, 2003, XP002360065 Retrieved from the Internet: URL: http://www.ipm.ac.ir/IPM/homepage/Amin 2.pdf [retrieved on Dec. 19, 2005].
Amon P. et al., "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT.2007.905521.
Anonymous: [Gruneberg, K., Narashimhan, S. and Chen, Y., editors]"Text of ISO/IEC 13818-1:2007/PDAM 6 MVC operation point descriptor", 90 MPEG Meeting; Oct. 26, 2009-Oct. 30, 2009; Xian; (Motion Picture Expertgroup or ISO/IEC JTC1/SC29/WG11), No. N10942, Nov. 19, 2009, XP030017441.
Anonymous: "Text of ISO/IEC 14496-12 3rd Edition", 83 MPEG Meeting; Jan. 14, 2008-Jan. 18, 2008; Antalya; (Motion Pictureexpert Group or ISO/IEC JTC1/SC29/WG11), No. N9678, Apr. 22, 2008, XP030016172.
Anonymous: "Text of ISO/IEC 14496-15 2nd edition", 91 MPEG Meeting; Jan. 18, 2010-Jan. 22, 2010; Kyoto; (Motion Picture Expertgroup or ISO/IEC JTC1/SC29/WG11), No. N11139, Jan. 22, 2010, XP030017636, ISSN: 0000-0030 the whole document.
Bar-Noy et al. "Efficient algorithms for optimal stream merging for media-on-demand," Draft (Aug. 2000), pp. 1-43.
Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 889-893, XP000464977.
Bitner, J.R., et al.: "Efficient Generation of the Binary Reflected Gray code and Its Applications," Communications of the ACM, pp. 517-521, vol. 19 (9), 1976.
Blomer, et al., "An XOR-Based Erasure-Resilient Coding Scheme," ICSI Technical Report No. TR-95-048 (1995) [avail. At ftp://ftp.icsi.berkeley.edu/pub/techreports/1995/tr-95-048.pdf].
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.
Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.
Cataldi et al., " Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.
Chen et al., "Response to the CFP on HTTP Streaming: Adaptive Video Streaming based on AVC", 93. MPEG Meeting; Jul. 26, 2010-Jul. 30, 2010; Geneva; (Motion Picture Expert Group or ISO/IEC JTC1/SC29/WG11), No. M17909, Jul. 26, 2010, XP030046499.
Choi S: "Temporally enhanced erasure codes for reliable communication protocols" Computer Networks, Elsevier Science Publishers B.V., Amsterdam, NL, vol. 38, No. 6, Apr. 22, 2002, pp. 713-730, XP004345778, ISSN: 1389-1286, DOI:10.1016/S1389-1286(01)00280-8.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/ 2009/614178.html> [retrieved on May 12, 2010].
Dan, A. et al.: "Scheduling Policies for an On-Demand Video Server with Batching," Proc. ACM Multimedia, pp. 15-23 (Oct. 1998).
Davey, M.C. et al.: "Low Density Parity Check Codes over GF(q)" IEEE Communications Letters, vol. 2, No. 6 pp. 165-167 (1998).
Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.
"Digital Video Broadcasting (DVB); Guidelines for the implementation of DVB-IP Phase 1 specifications; ETSI TS 102 542" ETSI Standards, Lis, Sophia Antipoliscedex, France, vol. BC, No. V1.2.1, Apr. 1, 2008, XP014041619 ISSN: 0000-0001 p. 43 p. 66 pp. 70, 71.
Eager, et al. "Minimizing bandwidth requirements for on-demand data delivery," Proceedings of the International Workshop on Advances in Multimedia Information Systems, p. 80-87 (Indian Wells, CA Oct. 1999).
Eager, et al., "Optimal and efficient merging schedules for video-on-demand servers", Proc. ACM Multimedia, vol. 7, pp. 199-202 (1999).
Esaki, et al.: "Reliable IP Multicast Communication Over ATM Networks Using Forward Error Correction Policy," IEICE Transactions on Communications, JP, Institute of Electronics Information and Comm. ENG. Tokyo, vol. E78-V, No. 12, (Dec. 1995), pp. 1622-1637, XP000556183.
Feng, G., Error Correcting Codes over $Z_{2m}$ for Algorithm-Based Fault-Tolerance, IEEE Transactions on Computers, vol. 43, No. 3, Mar. 1994, pp. 370-374.
Fernando, et al., "httpstreaming of MPEG Media—Response to CFP", 93 MPEG Meeting; Jul. 26, 2010-Jul. 30, 2010; Geneva; (Motion Picture Expert Group or ISO/IEC JTC1/SCE29/WG11), No. M17756, Jul. 22, 2010, XP030046346.
Fielding et al., "RFC 2616: Hypertext Transfer Protocol HTTP/1.1", Internet Citattion, Jun. 1999, pp. 165, XP002196143, Retrieved from the Internet: URL:http://www.rfc-editor-org/ [retrieved on Apr. 15, 2002].
Gao, L. et al., "Efficient Schemes for Broadcasting Popular Videos," Proc. Inter. Workshop on Network and Operating System Support for Digital Audio and Video, pp. 1-13 (1998).
Gasiba, Tiago et al., "System Design and Advanced Receiver Techniques for MBMS Broadcast Services" Proc. 2006 International Conference on Communications (ICC 2006), Jun. 1, 2006, pp. 5444-5450, XP031025781 ISBN: 978-1-4244-0354-7.
Gemmell, et al., "A Scalable Multicast Architecture for One-To-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US, Jun. 28, 1998, pp. 128-139, XP010291559.
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.
Gracie et al., " Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.
Hagenauer, J.: "Soft is better than hard" Communications, Coding and Cryptology, Kluwer Publication May 1994, XP002606615 Retrieved from the Internet: URL: http://www.Int.ei.turn.de/veroeffentlic hungen/I994/ccc94h.pdf [retrieved on Oct. 25, 2010].
Hershey, et al., "Random Parity Coding (Rpc)", 1996 IEEE International Conference on Communications (ICC). Converging Technologies for Tomorrow's Applications. Dallas, Jun. 23-27, 1996, IEEE International Conference on Communications (ICC), New York, IEEE, US, vol. 1, Jun. 23, 1996, pp. 122-126, XP00625654.
Plank J. S., "A Tutorial on Reed-Solomon Coding for Fault-Tolerance IN Raid-Like Systems", Software Practice & Experience, Wiley & Sons, Bognor Regis, GB, vol. 27, No. 9, Sep. 1, 1997, pp. 995-1012, XP00069594.

(56) References Cited

OTHER PUBLICATIONS

Pless and WC Huffman EDS V S: Algebraic geometry codes, Handbook of Coding Theory, 1998, pp. 871-961, XP002300927.
Pursley, et al.: "Variable-Rate Coding for Meteor-Burst Communications," IEEE Transactions on Communications, US, IEEE Inc. New York (1989) vol. 37, No. 11, pp. 1105-1112 XP000074533.
Pursley, M. et al.: "A Correction and an Addendum for Variable-Rate Coding for Meteor-Burst Communications," IEEE Transactions on Communications, vol. 43, No. 12 pp. 2866-2867 (Dec. 1995).
Pyle, et al., "Microsoft http smooth Streaming: Microsoft response to the Call for Proposal on httpstreaming", 93 MPEG Meeting; Jul. 26, 2010-Jul. 30, 2010; Geneva; (Motion Picture Expert Group or ISO/IEC JTC1/SCE29/WG11), No. M17902, Jul. 22, 2010, XP030046492.
Qualcomm Europe S A R L: "Baseline Architecture and Definitions for HTTP Streaming", 3GPP Draft;S4-090603_HTTP_Streaming_Architecture, 3rd Generation Partnership Project (3GPP), Mobile Competence Centre; 650, Route Des Lucioles; F-06921 Sophia-Antipolis Cedex; France, No. Kista; 20090812, Aug. 12, 2009, XP050356889.
Qualcomm Incorporated: "RaptorQ Technical Overview", pp. 1-12, Oct. 1, 2010.
Qualcomm Incorporated: "Use Cases and Examples for Adaptive httpstreaming", 3GPP Draft; S4-100408-Usecases-HSD, 3rd Generation Partnership Project (JGPP), Mobile Competence Centre; 650, Route Des Lucioles; F-06921 Sophia-Antipolis Cedex; France, vol. SA WG4, No. Prague, Czech Republic; 20100621, Jun. 17, 2010, XP050438085, [retrieved on Jun. 17, 2010].
Rangan, et al., "Designing an On-Demand Multimedia Service," IEEE Communiction Magazine, vol. 30, pp. 56-64, (Jul. 1992).
Realnetworks Inc et al., "Format for Http Streaming Media Presentation Description", 3GPP Draft; S4-100020, 3rd Generation Partnership Project (3GPP), Mobile Competence Centre; 650, Route Des Lucioles; F-06921 Sophia-Antipolis Cedex; France, vol. SA WG4, No. St. Julians, Malta; 20100125, Jan. 20, 2010, XP050437753, [retrieved on Jan. 20, 2010].
Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, No. Prague, Czech Republic; 20100621, Jun. 16, 2010, XP050438066, [retrieved on Jun. 16, 2010].
Rizzo L. "Effective Erasure Codes for Reliable Computer Communication Protocols," Computer Communication Review, 27 (2) pp. 24-36 (Apr. 1, 1997), XP000696916.
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Roca, V., et, al. "Low Density Parity Check (LDPC) Staircase and Triangle Forward Error Correction (FEC) Schemes", IETF RFC 5170 (Jun. 2008), pp. 1-34.
Rost, S. et al., "The Cyclone Server Architecture: streamlining delivery of popular content," 2002, Computer Communications, vol. 25, No. 4, pp. 1-10.
Seshan, S. et al., "Handoffs in Cellular Wireless Networks: The Daedalus Implementation and Experience," Wireless Personal Communications, NL; Kluwer Academic Publishers, vol. 4, No. 2 (Mar. 1, 1997) pp. 141-162, XP000728589.
Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T REC. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm''id=1148681>.
Shokrollahi et al., "Design of Efficient Easure Codes with Differential Evolution", IEEE International Symposium on Information Theory, Jun. 25, 2000, pp. 5-5.
Stockhammer, "WD 0.1 of 23001-6 Dynamic Adaptive Streaming over HTTP (DASH)", MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.
Sullivan et al., Document: JVT-AA007, "Editors' Draft Revision to ITU-T Rec. H.264|ISO/IEC 14496-10 Advanced Video Coding—in Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvt-site/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Telefon AB LM Ericsson, et al., "Media Presentation Description in httpstreaming", 3GPP Draft; S4-100080-MPD, 3rd Generation Partnership Project (3GPP), Mobile Competence Centre; 650, Route Des Lucioles; F-06921 Sophia-Antipolis Cedex; France, vol. SA WG4, No. St Julians, Malta; 20100125, Jan. 20, 2010, XP050437773, [retrieved on Jan. 20, 2010].
Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.
U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No. 13/205,574, by Ying Chen et al., filed Aug. 8, 2011.
Viswanathan, et al., "Metropolitan area video-on-demand services using pyramid broadcasting", Multimedia Systems, 4(4): 197-208 (1996).
Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).
Viswanathan,Subramaniyam R., "Publishing in Wireless and Wireline Environments," Ph. D Thesis, Rutgers, The State University of New Jersey (Nov. 1994), 180pages.
Watson, M., et, al. "Asynchronous Layered Coding (ALC) Protocol Instantiation", IETF RFC 5775, pp. 1-23, (Apr. 2010).
Wong, J.W., "Broadcast delivery", Proceedings of the IEEE, 76(12): 1566-1577, (1988).
Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.
Zorzi, et al.: "On the Statistics of Block Errors in Bursty Channels," IEEE Transactions on Communications, vol. 45, No. 6, Jun. 1997, pp. 660-667.
Hua, et al., "Skyscraper broadcasting: A new broadcsting system for metropolitan video-on-demand systems", Proc. ACM SIGCOMM, pp. 89-100 (Cannes, France, 1997).
Huawei et al., "Implict mapping between CCE and PUCCH for ACK/NACK TDD", 3GPP Draft; R1-082359, 3rd Generation Partnership Project (3GPP), Mobile Competence Centre; 650, Route Des Lucioles ; F-06921 Sophia-Antipolis Cedex; France, vol. RAN WG1, No. Warsaw, Poland, Jun. 24, 2008, XP050110650, [retrieved on Jun. 24, 2008].
IETF RFC 2733: Rosenberg, J. et al. "An RTP Payload Format for Generic Forward Error Correction," Network Working Group, RFC 2733 (Dec. 1999).

(56) References Cited

OTHER PUBLICATIONS

International Search Report and Written Opinion—PCT/US2010/025699—ISA/EPO—Jun. 18, 2010.
ISO/IEC JTC 1/SC 29, ISO/IEC FCD 23001-6, Information technology—MPEG systems technolgoies—Part 6: Dynamic adaptive streaming over HTTP (DASH), Jan. 28, 2011.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005, pp. 1097-1100, XP010792442, DOI: 10.1109/ICASSP.2005.1415905 ISBN: 978-0-7803-8874-1.
Juhn, L. et al.: "Adaptive Fast Data Broadcasting Scheme for Video-on-Demand Service," Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.
Kimura et al., "A Highly Mobile SDM-OFDM System Using Reduced-Complexity-and-Latency Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.
Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Lin, S. et al.: "Error Control Coding-Fundamentals and Applications," 1983, Englewood Cliffs, pp. 288, XP002305226.
Luby, et al., "Analysis of Low Density Codes and Improved Designs Using Irregular Graphs", 1998, Proceedings of the 30th Annual ACM Symposium on Theory of Computing, May 23, 1998, pp. 249-258, XP000970907.
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, et al., "Flute-File Delivery over Unidirectional Transport", IETF RFC 3926, Oct. 2004, pp. 1-35.
Luby et al., "Improved Low-Density Parity-Check Codes Using Irregular Graphs and Belief Propogation", Information Theory, 1998. Proceedings. 1998 IEEE International Symposium on Cambridge, MA, USA Aug. 16-21, 1998, pp. 1-9, New York, NY, USA, IEEE, US 16 August 199.
Luby et, al. "Layered Coding Transport (LCT) Building Block", IETF RFC 5651, pp. 1-42, (Oct. 2009).
Luby, M. et al.: "Efficient Erasure Correction Codes," 2001, IEEE Transactions on Information Theory, Vo. 47, No. 2, pp. 569-584, XP002305225.
Luby, M., et, al. "Forward Error Correction (FEC) Building Block", IETF RFC 5052, pp. 1-31, (Aug. 2007).
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Luby, M. et al., "Practical Loss-Resilient Codes: Tornado Codes," 29th Annual ACM Symposium on Theory of Computing, vol. Symp. 29, May 4, 1997, pp. 150-159, XP002271229.
Luby, M., et al., "Raptor Forward Error Correction Scheme for Object Delivery", IETF RFC5053, pp. 1-46 (Sep. 2007).
Luby M. et al., "RaptorQ Forward Error Correction Scheme for Object Delivery", IETF draft ietf-rmt-bb-fec-raptorq-04, Reliable Multicast Transport, Internet Engineering Task Force (IETF), Standard Workingdraft, Internet Society (ISOC), Aug. 24, 2010, pp. 1-68, XP015070705, [retrieved on Aug. 24, 2010].
Luby, Michael G. "Analysis of Random Processes via And-Or Tree Evaluation," Proceedings of the 9th Annual ACM-SIAM Symposium on Discrete Algorithms,TR-97-0, 1998, pp. 364-373, (search date: Jan. 25, 2010) URL: <http://portal. acm.prg.citation. cfm''id=314722>.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
Miller G., et al., "Bounds on the maximum likelihood decoding error probability of low density parity check codes", Information Theory, 2000. Proceedings. IEEE International Symposium on, 2000, p. 290.
Mimnaugh, a et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].
Min-Goo Kim: "On systematic punctured convolutional codes", IEEE Trans on Communications, vol. 45, No. 2, Feb. 1997, XP002628272, the whole document, pp. 133-139.
Moriyama, S., "5. Present Situation of Terrestrial Digital Broadcasting in Europe and USA", Journal of The Institute of Image Information and Television Engineers, Nov. 20, 1999, vol. 53, No. 11, pp. 1476-1478.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Muramatsu J., et al., "Low density parity check matrices for coding of multiple access networks", Information Theory Workshop, 2003. Proceedings, 2003 IEEE, Apr. 4, 2003, pp. 304-307.
Naguib, Ayman, et al., "Applications of Space-Time Block Codes and Interference Suppression for High Capacity and High Data Rate Wireless Systems," IEEE, 1998, pp. 1803-1810.
Narayanan, et al., "Physical Layer Design for Packet Data Over IS-136", Vehicular Technology Conference, 1997, IEEE 47th Phoenix, AZ, USA May 4-7, 1997, New York, NY, USA, IEEE, US May 4, 1997, pp. 1029-1033.
Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.
Nonnenmacher, et al., "Parity-Based Loss Recovery for Reliable Multicast Transmission", IEEE / ACM Transactions on Networking, IEEE Inc. New York, US, Vol. 6, No. 4, Aug. 1, 1998, pp. 349-361.
Ozden, B. et al.: "A Low-Cost Storage Service for Movie on Demand Databases," Proceedings of the 20th Very Large DataBases (VLDB) Conference, Santiago, Chile (1994).
Pa. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.
Pantos R et al., "HTTP Live Streaming; draft-pantos-http-1ive-streaming-OT.txt ", HTTP Live Streaming; Draftpant0s-HTTP-Live-Streaming-01.Txt, Internet Engineering Task Force, IETF; Standardworkingdraft, Internet Society (ISOC) 4, Rue Des Falaises CH—1205 Geneva, Switzerland, No. 1, Jun. 8, 2009, XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (Mascots), vol. 6, pp. 127-132 (Jul. 1998).

(56) References Cited

OTHER PUBLICATIONS

Perkins, et al.: "Survey of Packet Loss Recovery Techniques for Streaming Audio," IEEE Network; Sep./Oct. 1998, pp. 40-48.
3GPP TSG-SA4 #57 S4-100015, IMS based PSS and MBMS User Service extensions, Jan. 19, 2010, URL : http://www.3gpp.org/ftp/tsg_sa/WG4_CODEC/TSGS4_57/docs/S4-100015.zip.
3rd Generation Partnership Project, Technical Specification Group Services and System Aspects Transparent end-to-end packet switched streaming service (PSS), 3GPP file format (3GP) (Release 8), 3GPP Standard, 3GPP TS 26.244, 3rd Generation Partnership Project (3GPP), Mobile Competence Centre, 650, Route Des Lucioles, F-06921 Sophia-Antipolis Cedex , France, No. V8.1.0, Jun. 1, 2009, pp. 1-52, XP050370199.
3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 P.85-102,URL,http://www.3gpp.org/ftp/TSG_SA/WG4_Codec/TSGS4_59/Docs/S4-100511.zip, 26234-930.zip.
Anonymous: "Technologies under Consideration", 100. MPEG Meeting; Apr. 30, 2012-Apr. 5, 2012; Geneva; (Motion Picture Expert Group or ISO/IEC JTC1/SC29/WG11), No. N12682, Jun. 7, 2012, XP030019156.
Anonymous: "Technologies under Consideration", 98. MPEG Meeting; Nov. 28, 2011-Dec. 2, 2011; Geneva; (Motion Picture Expert Group or ISO/IEC JTC1/SC29/WG11), No. N12330, Dec. 3, 2011, XP030018825.
Anonymous: "Text of ISO/IEC IS 23009-1 Media Presentation Description and Segment Formats", 98. MPEG Meeting; Nov. 28, 2011-Dec. 2, 2012; Geneva; (Motion Picture Expert Group or ISO/IEC JTC1/SC29/WG11) No. N12329, Jan. 6, 2012, XP030018824.
Bar-Noy, et al., "Competitive on-line stream merging algorithms for media-on-demand", Draft (Jul. 2000), pp. 1-34.
Bouazizi I., et al., "Proposals for ALC/FLUTE server file format (14496-12Amd.2)", 77. MPEG Meeting; Jul. 17, 2006-Jul. 21, 2006; Klagenfurt; (Motion Pictureexpert Group or ISO/IEC JTC1/SC29/WG11), No. M13675, Jul. 12, 2006, XP030042344, ISSN: 0000-0236.
Digital Fountain: "Raptor code specification for MBMS file download," 3GPP SA4 PSM AD-HOC #31 (May 21, 2004) XP002355055 pp. 1-6.
Hannuksela M.M., et al., "DASH: Indication of Subsegments Starting with SAP", 97. MPEG Meeting; Jul. 18, 2011-Jul. 22, 2011; Torino; (Motion Picture Expert Group or ISO/IEC JTC1/SC29/WG11) No. m21096, Jul. 21, 2011, XP030049659.
Hannuksela M.M., et al., "ISOBMFF: SAP definitions and 'sidx' box", 97. MPEG Meeting;Jul. 18, 2011-Jul. 22, 2011; Torino; (Motion Picture Expert Group or ISO/IEC JTC1/SC29/WG11) No. m21435, Jul. 22, 2011, XP030049998.
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, CH, Oct. 1, 2007, XP015055125, ISSN: 0000-0003.
Luby et al., RaptorQ Forward Error Correction Scheme for Object Delivery draft-ietf-rmt-bb-fec-raptorq-00, Qualcomm, Inc. Jan. 28, 2010.
Luby M., "Simple Forward Error Correction (FEC) Schemes," draft-luby-rmt-bb-fec-supp-simple-00.txt, pp. 1-14, Jun. 2004.
Luby M., "LT Codes", Foundations of Computer Science, 2002, Proceedings, The 43rd Annual IEEE Symposium on, 2002.
Mandelbaum D.M., "An Adaptive-Feedback Coding Scheme Using Incremental Redundancy", IEEE Trans on Information Theory, vol. May 1974, May 1974, pp. 388-389, XP002628271, the whole document.

Morioka S., "A Verification Methodology for Error Correction Circuits over Galois Fields", Tokyo Research Laboratory, IBM Japan Ltd, pp. 275-280, Apr. 22-23, 2002.
Nokia: "Reed-Solomon Code Specification for. MBMS Download and Streaming Services", 3GPP Draft; S4-050265_RS_SPEC, 3rd Generation Partnership Project (3GPP), Mobile Competence Centre; 650, Route Des Lucioles ; F-06921 Sophia-Antipolis Cedex; France, vol. SA WG4, No. San Diego, USA; 20050415, Apr. 15, 2005, XP050287675, [retrieved on Apr. 15, 2005].
Ohashi a et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AH170_CR_AdaptiveHTTPStreaming-Full.doc.
Qualcomm Incorporated: "Corrections to 3GPP Adaptive HTTP Streaming", 3GPP TSG-SA4 #59 Change Request 26.234 CR0172 S4-100403, Jun. 16, 2010, URL, http//www.3gpp3org/FTP/tsg_sa/WG4_CODEC/TSGS4_59,Docs/S4-100403.zip, S4-100403_CR_26234-0172-AdaptiveHTTPStreaming-Rel-9.doc.
Rhyu, et al., "Response to Call for Proposals on httpstreaming of MPEG Media", 93 MPEG Meeting;Jul. 26, 2010-Jul. 30, 2010; Geneva; (Motion Picture Expert Group or ISO/IEC JTC1/SCE29/WG11) No. M17779, Jul. 26, 2010, XP030046369.
Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Samukawa, H. "Blocked Algorithm for LU Decomposition" Journal of the Information Processing Society of Japan, Mar. 15, 1993, vol. 34, No. 3, pp. 398-408.
Sincoskie, W. D., "System Architecture for Large Scale Video on Demand Service," Computer Network and ISDN Systems, pp. 155-162, (1991).
Taiwan Search Report—TW099105858—TIPO—Oct. 13, 2013.
Todd, "Error Correction Coding: Mathematical Methods and Algorithms", Mathematical Methods and Algorithms, Jan. 1, 2005, pp. 451-534, Wiley, XP002618913.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, pp. 1-178.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
Yamazaki M., et al., "Multilevel Block Modulation Codes Construction of Generalized DFT,".0 Technical Report of the Institute of Electronics, Information and Communication Engineers, Jan. 24, 1997, vol. 96, No. 494, pp. 19-24, IT96-50.
Charles Lee L.H, "Error-Control Block Codes for Communications Engineers", 2000, Artech House, XP002642221 pp. 39-45, (Linear Block Codes).
DVB-IPI Standard: DVB BlueBook A086r4 (Mar. 2007) Transport of MPEG 2 Transport Streatm (TS) Based DVB Services over IP Based Networks, ETSI Technical Specification 102 034 v1.3.1.
Luby M et al: "IPTV Systems, Standards and Architectures: Part II—Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M., et al., "Request for Comments: 3453: The Use of Forward Error Correction (FEC) in Reliable Multicast," Internet Article, [Online] Dec. 2002, pp. 1-19.
Mackay, "Fountain codes Capacity approaching codes design and implementation", IEE Proceedings: Communications, Dec. 9, 2005,

(56) References Cited

OTHER PUBLICATIONS pp. 1062-1068, vol. 152, No. 6, Institution of Elecrical Engineers, XP006025749, ISSN: 1350-2425, DOI: 10.1049/IP-C0M:20050237.

Makoto N., et al., "On Tuning of Blocking LU decomposition for VP2000 series" The 42th Information Processing Society of Japan Conference (1st term in 1991) Feb. 25, 1991, pp. 71-72, 4B-8, (English absract).

Chikara S., et al., " Add-on Download Scheme for Multicast Content Distribution Using LT Codes", IEICE. B, Communcations, Aug. 1, 2006, J89-B (8), pp. 1379-1389.

Clark G.C., et al., "Error Correction Coding for Digital Communications, System Applications," Error Correction Coding for Digital Communications, New York, Plenum Press, US, Jan. 1, 1981, pp. 331-341.

Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.

Tetsuo M., et al., " Comparison of Loss Resilient Ability between Multi-Stage and Reed-Solomon Coding", Technical report of IEICE. CQ, Communication Quality, vol. 103 (178), Jul. 4, 2003, pp. 19-24.

Watson M., et al., "Forward Error Correction (FEC) Framework draft-ietf-fecframe-framework-11," 2011, pp. 1-38, URL,http://tools.ietf.org/pdf/draft-ietf-fecframe-framework-11.pdf.

Ramsey B, "HTTP Status: 206 Partial Content and Range Requests," May 5, 2008 obtained at http://benramsey.com/blog/2008/05/206-partial-content-and-range-requests/.

Frojdh P., et al., "Study on 14496-12:2005/PDAM2 ALU/FLUTE Server File Format", 78.MPEG Meeting; Oct. 23, 2006-Oct. 27, 2006; Hangzhou: (Motion Picturexpert Group or ISO/IEC JTC1/SC29/WG11) No. M13855, Oct. 13, 2006, XP030042523, ISSN: 0000-0233.

Gerard F., et al., "HTTP Streaming MPEG media—Response to CFP", 93. MPEG Meeting, Geneva Jul. 26, 2010 to Jul. 30, 2010.

Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.

Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.

Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.

\* cited by examiner

MOBILE RECEPTION OF DIGITAL VIDEO BROADCASTING—TERRESTRIAL SERVICES

PRIORITY

This application claims the benefit of U.S. Provisional Application No. 61/156,431, entitled "Mobile Reception of DVB-T Services," filed Feb. 27, 2009, and U.S. Provisional Application No. 61/156,828, entitled "Mobile Reception of DVB-T Services," filed Mar. 2, 2009, both of which are assigned to the assignee hereof and are hereby expressly incorporated by reference herein for all purposes.

CROSS-REFERENCES TO RELATED APPLICATIONS

The following references are included here and are incorporated by reference for all purposes:

U.S. Pat. No. 7,068,729 entitled "Multi-Stage Code Generator and Decoder for Communication Systems" issued to Shokrollahi, et al. (hereinafter "Shokrollahi").

U.S. Non-Provisional patent application Ser. No. 12/210,024, entitled "Generating and Communicating Source Identification Information to Enable Reliable Communications" by Chen, et al. (hereinafter "Chen"), filed Sep. 12, 2008.

BACKGROUND

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity, which characterizes most physically realizable systems, one concern is how to deal with data that is lost or corrupted in transmission. Lost data (erasures) are often easier to deal with than corrupted data (errors) because the recipient cannot always recognize when the transmitted data has been corrupted.

Many error-correcting codes have been developed to correct erasures and/or errors. Typically, the particular code used is chosen based on some information about the infidelities of the channel through which the data is being transmitted, and the nature of the data being transmitted. For example, where the channel is known to have long periods of infidelity, a burst error code might be best suited for that application. Where only short, infrequent errors are expected, a simple parity code might be best.

"Communication," as used herein, refers to data transmission, through space and/or time, such as data transmitted from one location to another or data stored at one time and used at another. The channel is that which separates the sender and receiver. Channels in space can be wires, networks, fibers, wireless media, etc. between a sender and receiver. Channels in time can be data storage devices. In realizable channels, there is often a nonzero chance that the data sent or stored by the sender is different when it is received or read by the recipient and those differences might be due to errors introduced in the channel.

Data transmission is straightforward when a transmitter and a receiver have all of the computing power and electrical power needed for communications, and the channel between the transmitter and receiver is reliable enough to allow for relatively error-free communications. Data transmission becomes more difficult when the channel is in an adverse environment, or the transmitter and/or receiver has limited capability. In certain applications, uninterrupted error-free communication is required over long periods of time. For example, in digital television systems it is expected that transmissions will be received error-free for periods of many hours at a time. In these cases, the problem of data transmission is difficult even in conditions of relatively low levels of errors.

Another scenario in which data communication is difficult is where a single transmission is directed to multiple receivers that may experience widely different data loss conditions. Furthermore, the conditions experienced by one given receiver may vary widely or may be relatively constant over time.

One solution to dealing with data loss (errors and/or erasures) is the use of forward error correcting (FEC) techniques, wherein data is coded at the transmitter in such a way that a receiver can correct transmission erasures and errors. Where feasible, a reverse channel from the receiver to the transmitter enables the receiver to relay information about these errors to the transmitter, which can then adjust its transmission process accordingly. Often, however, a reverse channel is not available or feasible, or is available only with limited capacity. For example, in cases in which the transmitter is transmitting to a large number of receivers, the transmitter might not be able to maintain reverse channels from all the receivers. In another example, the communication channel may be a storage medium.

For example, data may be transmitted chronologically forward through time, and causality precludes a reverse channel that can fix errors before they happen. As a result, communication protocols often need to be designed without a reverse channel or with a limited capacity reverse channel and, as such, the transmitter may have to deal with widely varying channel conditions without prior knowledge of those channel conditions. One example is a broadcast or multicast channel, where reverse communication is not provided, or if provided is very limited or expensive. Another example where such a situation is relevant is a storage application, where the data is stored encoded using FEC, and then at a later point of time, the data is recovered, possibly using FEC decoding.

In the case of a packet protocol used for data transport over a channel that can lose packets, a file, stream, or other block of data to be transmitted over a packet network is partitioned into source symbols (that may all be of equal size or that may vary in size depending on the block size or on other factors). Encoding symbols are generated from the source symbols using an FEC code, and the encoding symbols are placed and sent in packets. The "size" of a symbol can be measured in bits, whether or not the symbol is actually broken into a bit stream, where a symbol has a size of M bits when the symbol is selected from an alphabet of $2^M$ symbols. In such a packet-based communication system, a packet-oriented erasure FEC coding scheme might be suitable.

A file transmission is called reliable if it enables the intended recipient to recover an exact copy of the original file despite erasures and/or other corruption of the data transmitted over a network. A stream transmission is called reliable if it enables the intended recipient to recover an exact copy of each part of the stream in a timely manner despite erasures and/or corruption within the network. Both file transmission and stream transmission can instead be not entirely reliable, but somewhat reliable, in the sense that some parts of the file or stream are not recoverable or, for streaming, some parts of the stream might be recoverable but not in a timely fashion. It is often a goal to provide as high reliability as possible depending on some constraining conditions, where examples of constraints might be timely delivery for streaming applications, or the type of network conditions over which a solution is expected to operate.

Packet loss often occurs because sporadic congestion causes the buffering mechanism in a router to reach its capacity, forcing it to drop incoming packets. Other causes of packet loss include weak signal, intermittent signal, and noise interference wherein corrupted packets are discarded. Protection against erasures during transport has been the subject of much study.

In a system in which a single transmission is directed to more than one receiver, and in which different receivers experience widely different conditions, transmissions are often configured for some set of conditions between the transmitter and any receiver, and any receivers that are in worse conditions may not receive the transmission reliably.

Erasure codes are known which provide excellent recovery of lost packets in such scenarios. For example, Reed-Solomon codes are well known and can be adapted to this purpose. However, a known disadvantage of Reed-Solomon codes is their relatively high computational complexity. Chain reaction codes, including LT™ chain reaction codes and Raptor™ multi-stage chain reaction ("MSCR") codes, provide excellent recovery of lost packets, and are highly adaptable to varying channel conditions. For example, Shokrollahi describes aspects of multi-stage chain reaction codes. Herein, the term "chain reaction code" should be understood to include chain reaction codes or multi-stage chain reaction codes, unless otherwise indicated.

In some cases, it may be necessary or desirable to increase the reliability of a communications system after deployment. However, while an improvement in network reliability may be needed, it is typically not feasible to replace or upgrade all receiving devices in the network at once or at all. For example, it might turn out that actual network packet loss is higher than initially planned, due to degradations in network reliability, increased traffic load, expansions and/or changes in the network, etc., or the quality of service requirements may need to increase to match competitive services, but it might be impractical to get new receivers out to all nodes of the communications system at once or to distribute them over time and have some receiving stations out of commission until the new receivers arrive.

In order to deliver the best possible service at the lowest cost, communications systems must simultaneously balance conflicting resource constraints. Network bandwidth is a critical resource constraint. Transmitting and receiving devices need to enable efficient use of network bandwidth in supporting a reliable service. The available CPU processing on receiving devices is typically a severe limitation, meaning that any transport reliability enhancement method must require only a modest amount of computing effort. In addition, it is also often necessary, particularly with streaming media, to limit the incremental latency associated with reliable transport methods so that the end-user does not perceive a reduction in system responsiveness.

SUMMARY

An exemplary method of protecting data with application layer forward error correction in a communication system, wherein the communication system includes first devices with legacy receivers and second devices with FEC-enabled receivers, and operation of the legacy receivers is not affected by the application layer forward error correction, according to the disclosure includes: determining a duration period; assembling packets of source data into source blocks corresponding to the duration period, each source block including a number of packets of source data; encoding the source blocks to generate encoded blocks, each encoded block including a number of packets of repair data; and transmitting the packets of repair data.

Embodiments of such a method may include one or more of the following features. The data includes Digital Video Broadcasting—Terrestrial data. The method further includes separating or partitioning the packets of source data from a data stream. The number of packets of repair data of an encoded block is greater than the number of packets of source data of a source block. The method further includes determining which packets of source data from a data stream to assemble into source blocks, wherein at least some of the packets of source data from the data stream are not assembled into source blocks. The method further includes determining a protection amount for the source blocks, wherein the source blocks are encoded based on the protection amount.

An exemplary method of receiving data protected with application layer forward error correction in a communication system, wherein the communication system includes first devices with legacy receivers and second devices with FEC-enabled receivers, and operation of the legacy receivers is not affected by the application layer forward error correction, includes: receiving packets of repair data; assembling the received packets of repair data into encoded blocks, each encoded block including a number of packets of repair data; decoding the encoded blocks to generate source blocks, each source block corresponding to a predetermined duration period and including a number of packets of source data; and assembling the packets of source data to reproduce a transmitted data stream.

Embodiments of such a method may include one or more of the following features. The transmitted data stream includes Digital Video Broadcasting—Terrestrial data. The method further includes separating or partitioning the packets of repair data from a received data stream. The encoded blocks are decoded based on a predetermined protection amount.

An apparatus configured to protect data with application layer forward error correction in a communication system, wherein the communication system includes first devices with legacy receivers and second devices with FEC-enabled receivers, and operation of the legacy receivers is not affected by the application layer forward error correction, includes: a processor configured to determine a duration period, and assemble packets of source data into source blocks corresponding to the duration period, each source block including a number of packets of source data; an encoder communicatively coupled to the processor and configured to encode the source blocks to generate encoded blocks, each encoded block including a number of packets of repair data; and a transmitter communicatively coupled to the encoder and configured to transmit the packets of repair data.

Embodiments of such an apparatus may include one or more of the following features. The data includes Digital Video Broadcasting—Terrestrial data. The processor is further configured to separate or partition the packets of source data from a data stream. The number of packets of repair data of an encoded block is greater than the number of packets of source data of a source block. The processor is further configured to determine which packets of source data from a data stream to assemble into source blocks, wherein at least some of the packets of source data from the data stream are not assembled into source blocks. The processor is further configured to determine a protection amount for the source blocks; and the encoder is configured to encode the source blocks based on the protection amount.

An apparatus configured to receive data protected with application layer forward error correction in a communication system, wherein the communication system includes first devices with legacy receivers and second devices with FEC-enabled receivers, and operation of the legacy receivers is not affected by the application layer forward error correction, includes: a receiver configured to receive packets of repair data; an assembly module communicatively coupled to the receiver and configured to assemble the received packets of repair data into encoded blocks, each encoded block including a number of packets of repair data; and a decoder communicatively coupled to the assembly module and configured to decode the encoded blocks to generate source blocks, each source block corresponding to a predetermined duration period and including a number of packets of source data, wherein the assembly module is further configured to assemble the packets of source data to reproduce a transmitted data stream.

Embodiments of such an apparatus may include one or more of the following features. The apparatus further includes a processor communicatively coupled to the receiver and configured to determine that an identifier associated with the repair data corresponds with a desired service. The receiver is configured to receive the packets of repair data as part of a received data stream including the packets of repair data, packets of source data of the desired service, and packets of data of other services; and the apparatus further includes a de-multiplexer communicatively coupled to the receiver and configured to de-multiplex the packets of repair data and the packets of source data of the desired service from the received data stream. The transmitted data stream includes Digital Video Broadcasting—Terrestrial data. The decoder is configured to decode the encoded blocks based on a predetermined protection amount.

An apparatus configured to receive data protected with application layer forward error correction in a communication system includes: a receiver configured to receive packets of source data of a desired service and packets of repair data for the desired service, wherein the repair data is for correcting errors in the source data of the desired service; a processor communicatively coupled to the receiver and configured to determine that a first identifier associated with the source data corresponds with the desired service, determine that a second identifier associated with the repair data does not correspond with the desired service, and discard the packets of repair data; and an assembly module communicatively coupled to the processor and configured to assemble the packets of source data to reproduce a transmitted data stream of the desired service.

Embodiments of such an apparatus may include the feature wherein the transmitted data stream includes Digital Video Broadcasting—Terrestrial data.

A computer program product for protecting data with application layer forward error correction in a communication system, wherein the communication system includes first devices with legacy receivers and second devices with FEC-enabled receivers, and operation of the legacy receivers is not affected by the application layer forward error correction, includes a processor-readable medium storing processor-readable instructions configured to cause a processor to: determine a duration period; assemble packets of source data into source blocks corresponding to the duration period, each source block including a number of packets of source data; encode the source blocks to generate encoded blocks, each encoded block including a number of packets of repair data; and transmit the packets of repair data.

Embodiments of such a product may include one or more of the following features. The data includes Digital Video Broadcasting—Terrestrial data. The processor-readable medium is further configured to cause the processor to separate or partition the packets of source data from a data stream. The number of packets of repair data of an encoded block is greater than the number of packets of source data of a source block. The processor-readable medium is further configured to cause the processor to determine which packets of source data from a data stream to assemble into source blocks, wherein at least some of the packets of source data from the data stream are not assembled into source blocks. The processor-readable medium is further configured to cause the processor to determine a protection amount for the source blocks, wherein the source blocks are encoded based on the protection amount.

A computer program product for receiving data protected with application layer forward error correction in a communication system, wherein the communication system includes first devices with legacy receivers and second devices with FEC-enabled receivers, and operation of the legacy receivers is not affected by the application layer forward error correction, includes a processor-readable medium storing processor-readable instructions configured to cause a processor to: receive packets of repair data; assemble the received packets of repair data into encoded blocks, each encoded block including a number of packets of repair data; decode the encoded blocks to generate source blocks, each source block corresponding to a predetermined duration period and including a number of packets of source data; and assemble the packets of source data to reproduce a transmitted data stream.

Embodiments of such a product may include one or more of the following features. The transmitted data stream includes Digital Video Broadcasting—Terrestrial data. The processor-readable medium is further configured to cause the processor to separate or partition the packets of repair data from a received data stream. The encoded blocks are decoded based on a predetermined protection amount.

A system configured to protect data with application layer forward error correction in a communication system, wherein the communication system includes first devices with legacy receivers and second devices with FEC-enabled receivers, and operation of the legacy receivers is not affected by the application layer forward error correction, includes: means for determining a duration period; means for assembling packets of source data into source blocks corresponding to the duration period, each source block including a number of packets of source data; means for encoding the source blocks to generate encoded blocks, each encoded block including a number of packets of repair data; and means for transmitting the packets of repair data.

Embodiments of such a system may include one or more of the following features. The data includes Digital Video Broadcasting—Terrestrial data. The system further includes means for separating or partitioning the packets of source data from a data stream. The number of packets of repair data of an encoded block is greater than the number of packets of source data of a source block. The system further includes means for determining which packets of source data from a data stream to assemble into source blocks, wherein at least some of the packets of source data from the data stream are not assembled into source blocks. The system further includes means for determining a protection amount for the source blocks, wherein the source blocks are encoded based on the protection amount.

A system configured to receive data protected with application layer forward error correction in a communication system, wherein the communication system includes first devices with legacy receivers and second devices with FEC-enabled receivers, and operation of the legacy receivers is not affected by the application layer forward error correction, includes: means for receiving packets of repair data; means for assembling the received packets of repair data into encoded blocks, each encoded block including a number of packets of repair data; means for decoding the encoded blocks to generate source blocks, each source block corresponding to a predetermined duration period and including a number of packets of source data; and means for assembling the packets of source data to reproduce a transmitted data stream.

Embodiments of such a system may include one or more of the following features. The transmitted data stream includes Digital Video Broadcasting—Terrestrial data. The system further includes means for separating or partitioning the packets of repair data from a received data stream. The encoded blocks are decoded based on a predetermined protection amount.

Items and/or techniques described herein may provide one or more of the following capabilities. Application Layer Forward Error Correction (AL-FEC) protection in a Digital Video Broadcasting—Terrestrial (DVB-T) network increases the robustness of the transmitted information and provides reception in mobile channels. The described mechanisms allow the transmission of additional parity needed for error correction in a fully backwards-compatible way, i.e., in such a way that legacy DVB-T receivers are not impacted by the additional FEC. Providing AL-FEC protection for DVB-T services using raptor codes, which are efficient and lightweight in terms of decoding complexity, allows the FEC decoding to be done in generic software processors even on low-complexity devices. Thus, hardware upgrades can be eliminated or reduced. AL-FEC can be used in existing networks and services to extend the mobile reception of DVB-T services to provide partial coverage of the service area. AL-FEC protection can be used in conjunction with other technical solutions (e.g., antenna diversity techniques and hierarchical modulation) to further enhance the mobile reception of DVB-T services in existing networks. While item/technique-effect pairs have been described, it may be possible for a noted effect to be achieved by means other than those noted, and a noted item/technique may not necessarily yield the noted effect.

Figure 1:
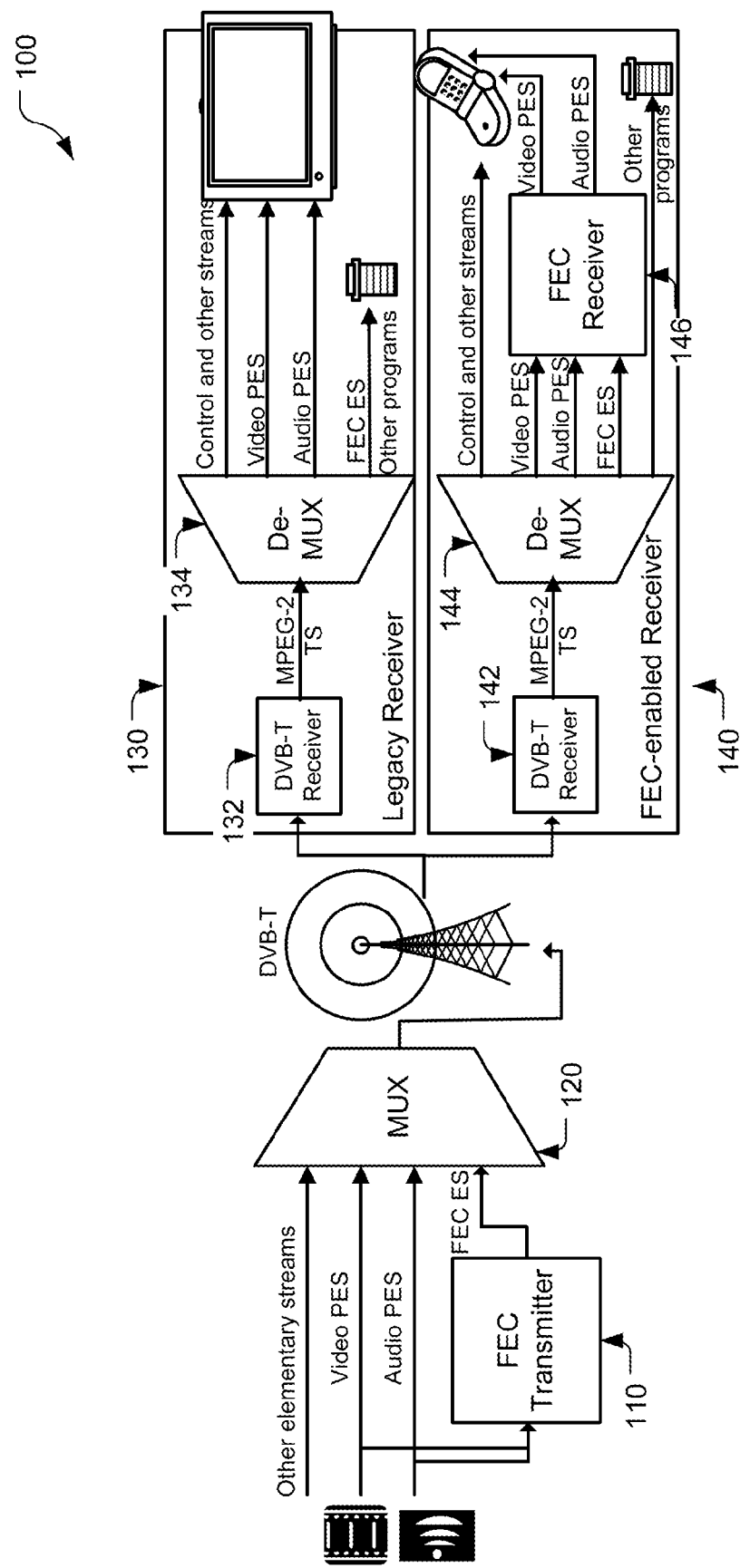
FIG. 1 is a block diagram of a communication system that supports DVB-T services in both legacy and FEC-enabled receivers.

In the figures, components with similar relevant characteristics and/or features may have the same reference label.

DETAILED DESCRIPTION

Techniques described herein provide mechanisms for protecting data with AL-FEC in a communication system. The communication system includes first devices with legacy receivers and second devices with FEC-enabled receivers, where operation of the legacy receivers is not affected by the application layer forward error correction. A duration period can be determined, and packets of source data are assembled into source blocks corresponding to the duration period. The source blocks are then encoded to generate encoded blocks, which each include a number of packets of repair data. The packets of repair data are transmitted. Mechanisms for receiving data protected with AL-FEC in a communication system are also provided. Packets of repair data are received and assembled into encoded blocks. The encoded blocks are decoded to generate source blocks, which each correspond to a predetermined duration period and include a number of packets of source data. The packets of source data are assembled to reproduce a transmitted data stream. The protected data can include DVB-T data. A protection amount for the source blocks can be determined, where the encoding and decoding is based on the protection amount. Other embodiments are within the scope of the disclosure and claims.

Although the focus in this disclosure is on DVB-T, the described techniques are not limited to application in DVB-T. The described techniques can apply, for example, to Digital Video Broadcasting (DVB-S) and Digital Video Broadcasting—Cable (DVB-C) as well as other wireless or fixed network distribution systems, such as Advanced Television Systems Committee (ATSC) or Integrated Services Digital Broadcasting—Terrestrial (ISDB-T).

Digital Video Broadcasting—Terrestrial (DVB-T)

Digital Terrestrial Television (DTT) networks are being deployed worldwide, and it is planned that DTT services completely replace analog TV in many European countries by 2012 at the latest. DVB-T is the European standard of DTT and has been adopted by many countries all over the world to provide DTT services. DVB-T was designed for fixed and portable reception, but DVB-T does not generally provide enough robustness in mobile environments. Mobile reception, as described in more detail below, is characterized by fluctuations of the received signal caused by fast fading and shadowing. These fluctuations cause the loss of portions of information over time and challenge the reception of DVB-T services in mobile environments. A main reason for this is the short time interleaving, up to approximately 1 ms, performed in the physical layer.

Digital Video Broadcasting—Transmission System for Handheld Terminals (DVB-H), a European digital mobile TV standard, is a technological evolution of DVB-T and was developed specifically for the provision of mobile TV services. DVB-H reutilizes the physical layer of DVB-T and introduces a set of enhancements in the link layer in order to adapt the transmission to mobile reception. These enhancements are aimed to reduce the terminal power consumption and to counteract the fast fading. A link layer protection mechanism called Multi Protocol Encapsulation—Forward Error Correction (MPE-FEC) increases the robustness in mobile environments, whereas a bursty transmission technique referred to as time slicing reduces the power consumption in receivers by up to 90%. Simulations for DVB-H have shown that by means of MPE-FEC, it is possible to obtain gains between 4 and 9 dB for mobile users when compared to DVB-T. Furthermore, the maximum Doppler tolerance increases by about 50% for mobile channels while reutilizing the physical layer of DVB-T.

AL-FEC has been standardized in DVB-H for file delivery services. An advantage of AL-FEC is that it can spread the protection over large portions of information. AL-FEC takes advantage of the spatial diversity derived from user mobility by the use of extensive time interleaving (e.g., up to minutes or even hours) and increases the robustness of the transmitted information in the presence of shadowing. AL-FEC has also been proposed for DVB-H streaming services in the form of multi-burst protection. Despite excellent performance, the main drawback of this approach is an increase in the channel switching times, which is considered a critical parameter in mobile TV usability.

Despite the fact that the physical layer of DVB-H is compatible with DVB-T, DVB-H encapsulates all the audio-visual information in IP (Internet Protocol) datagrams and generally simulcasts the services with lower quality than the MPEG-2 Transport Stream (MPEG-2 TS) signal in DVB-T. Therefore, DVB-H requires the allocation of specific bandwidth for the transmission of the mobile TV content. On the other hand, in some studies as well as even deployments, mobile reception of DVB-T has been verified. In order to enable mobile reception of current DVB-T services, antenna diversity techniques have been proposed. It is claimed that the reception by means of two antennas and Maximum Ratio Combining (MRC) results in a link margin gain from 3 to 9 dB depending on the reception conditions. However, for handset-based reception, multiple receive antennas are generally impractical as the correlation distance of the antennas is far beyond the dimensions of typical handsets.

Mobile Reception of DVB-T

Mobile channels are characterized by rapid variations of the received signal over time referred to as fast fading. Fast fading is caused by the Doppler shift of multiple propagation paths, which originates from the movement of the receiver with respect to the transmitter. Fast fading results in corruption of small portions of the data stream in a bursty manner. Higher velocities involve higher values of Doppler shift and thus, a greater degradation of the received information. If the user velocity is too high, the Doppler shift may increase above the values supported by the physical layer, corrupting great portions of the received information. The Carrier to Noise (C/N) sensitivity required for the proper reception of DVB-T tends to increase proportionally with the Doppler shift due to inter-carrier interference (ICI) up to a maximum Doppler value, from which reception is no longer possible. The protection applied by the physical layer of DVB-T extends only to the duration of one Orthogonal Frequency Division Multiplexing (OFDM) symbol (i.e., approximately 1 ms), and it is not able to cope with the error bursts resulting from fast fading.

DVB-H reutilizes the physical layer of DVB-T, but integrated MPE-FEC at the link layer to repair the errors caused by mobile reception. MPE-FEC is an intra burst mechanism for which the protection is performed on a per burst basis. MPE-FEC protection spreads over the duration of one burst, of length 0.1 to 0.4 s, and it is capable of counteracting the effects of fast fading. By means of MPE-FEC, it is possible to achieve a performance that is almost independent of the Doppler and in addition, the maximum Doppler supported by the system can be increased.

In order to cope with mobile reception impairments in DVB-T systems, antenna diversity techniques have been proposed. It has been claimed that, by means of two antennas, it is possible to improve the reception of DVB-T services in the presence of fast fading by up to 9 dB and to increase the maximum Doppler by more than a factor of three. Although antenna diversity can be implemented in vehicles, it is not suited for the handheld reception of DVB-T services. In antenna diversity scenarios, the separation between antennas is proportional to the frequency of operation, and the separation required in the ultra high frequency (UHF) band generally exceeds the size of handheld terminals.

The received signal in mobile channels is also characterized by slow variations known as shadowing. Shadowing results from the presence of large obstacles, such as buildings or hills that may block the line-of-sight between the receiver and the transmitter. Shadowing can be modeled as a log-normal distributed variation of the received signal over the area of coverage. When a user is moving in the presence of shadowing, the received signal may experience outages that corrupt longer periods of the data stream.

However, mobile users can take advantage of the spatial diversity resulting from shadowing in order to increase the temporal diversity of the received signal. Signal outages can be corrected if the protection of the physical or upper layers is spread over time. This can be achieved by encoding a large amount of information jointly. Such link layer protection has been standardized for use in DVB systems.

System Architecture for AL-FEC Protection of DVB-T Services

Referring to FIG. 1, a block diagram of a communication system 100 that supports DVB-T services in both legacy and FEC-enabled receivers is shown. FIG. 1 shows an example of a seamless upgrade path for the communication system 100 for supporting AL-FEC protection of DVB-T services.

Packetized elementary streams (PESs) of a program to be protected are processed by an FEC transmitter 110. In one example, a television program can include a video PES and an audio PES. The FEC transmitter 110 generates an FEC elementary stream that is multiplexed by the multiplexer 120 with the video PES, the audio PES, and other elementary streams (e.g., captioning, Teletext or data information) into a Moving Picture Experts Group-2 Transport Stream (MPEG-2 TS), which is distributed over the DVB-T network. In DVB-T services, several television programs, each composed of several elementary streams, can be multiplexed in the same MPEG-2 TS. Preferably, the FEC elementary stream is sent with as low overhead as possible, as bit rate is generally scarce and expensive in digital terrestrial systems.

The FEC elementary stream is multiplexed in a fully backwards-compatible way such that legacy receivers discard the FEC elementary stream without affecting their operations. That is, although the MPEG-2 TS will be transmitted with a new FEC elementary stream not used in existing DVB-T services, existing legacy receivers will not need any changes to be able to extract a desired service from the received MPEG-2 TS with the multiplexed FEC elementary stream. A legacy receiver 130, e.g., a receiver of an existing high definition television, includes a DVB-T receiver 132 and a de-multiplexer 134. The DVB-T receiver 132 receives the MPEG-2 TS. The de-multiplexer 134 de-multiplexes the received MPEG-2 TS into separate elementary streams, including the FEC elementary stream, and drops the FEC elementary stream while retaining the video PES, the audio PES, control, and the other streams needed to display the desired service.

An FEC-enabled receiver 140, e.g., a receiver of a new DVB-T capable mobile device, includes a DVB-T receiver 142, a de-multiplexer 144, and an FEC receiver 146. The DVB-T receiver 142 receives the MPEG-2 TS, and the de-multiplexer 144 de-multiplexes the received MPEG-2 TS into separate elementary streams. The video PES, the audio PES, and the FEC elementary stream are processed by the FEC receiver 146 to reconstruct lost audio and video data of the audio PES and the video PES, respectively, such that the original program can be reconstructed. Preferably, the FEC-enabled receivers are able to reconstruct as much data as possible using the FEC elementary stream.

The FEC stream generated by the FEC encoder consumes part of the bit rate capacity at the physical layer and thus, the number of services carried per MPEG-2 TS may have to be reduced in order to accommodate the FEC data. Unlike DVB-H, AL-FEC protection of DVB-T services allows the same multimedia content transmitted to fixed receivers to be protected for its use by mobile users. Therefore, no additional content is needed for transmission of mobile services, and only the capacity required for carrying the FEC data need be taken into account to support mobile reception.

MPEG-2 TS Protocol of DVB-T Services

In DVB-T, all the content is multiplexed in a MPEG-2 TS and transmitted as a sequence of TS packets. Each TS packet carries a header of 4 bytes and a payload of 184 bytes. The MPEG-2 TS contains all the data from the services multiplexed in the MPEG-2 TS along with signaling information, which is carried in the form of Program Specific Information/Service Information (PSI/SI) tables. Generally, several services (e.g., television programs, radio programs, and data channels) are multiplexed in the one MPEG-2 TS as elementary streams. The header of each TS packet contains a 13-bit Packet IDentifier (PID) that uniquely identifies the elementary stream that is carried inside the TS packet. The header of the TS packets also contains a Transport Error Indicator (TEI) bit and a Continuity Counter (CC) field that can be used for the detection of erroneous and missing packets.

Each elementary stream is assigned a unique PID value inside the MPEG-2 TS. The associations between elementary streams and PID values are transmitted in the PSI/SI tables. The DVB-T receivers 132, 142 parse the PSI/SI tables in order to identify the PID values of the elementary streams that correspond to the desired service. The MPEG-2 TS packets carrying the video, audio, or data information of the desired service are de-multiplexed by reading the PID value of every MPEG-2 TS packet.

Forward Error Correction

FEC mechanisms are designed to cope with the loss of information by transmitting additional repair data. Erasure codes are often used in FEC mechanisms as they can regenerate lost portions of information transmitted over an erasure channel. The information to be protected is partitioned into source blocks, each of them including k different source symbols. An erasure encoder is used in the transmitter to encode the source blocks and generate a total amount of n symbols per source block where n>k. If a systematic code is used, the original k source symbols are among the total n symbols generated by the encoding algorithm. The k original source symbols are transmitted along with n−k repair symbols. Assuming an erasure channel, some of the n transmitted symbols are erased and are not available at the receiver. An erasure decoder is capable of recovering the erased symbols if a sufficient number of source and repair symbols is received.

An ideal erasure code is capable of recovering the k original source symbols if at least any k symbols among the n transmitted symbols are received. A practical low-complexity erasure code generally requires a small additional number of symbols in order to recover all original transmitted source symbols.

Figure 2:
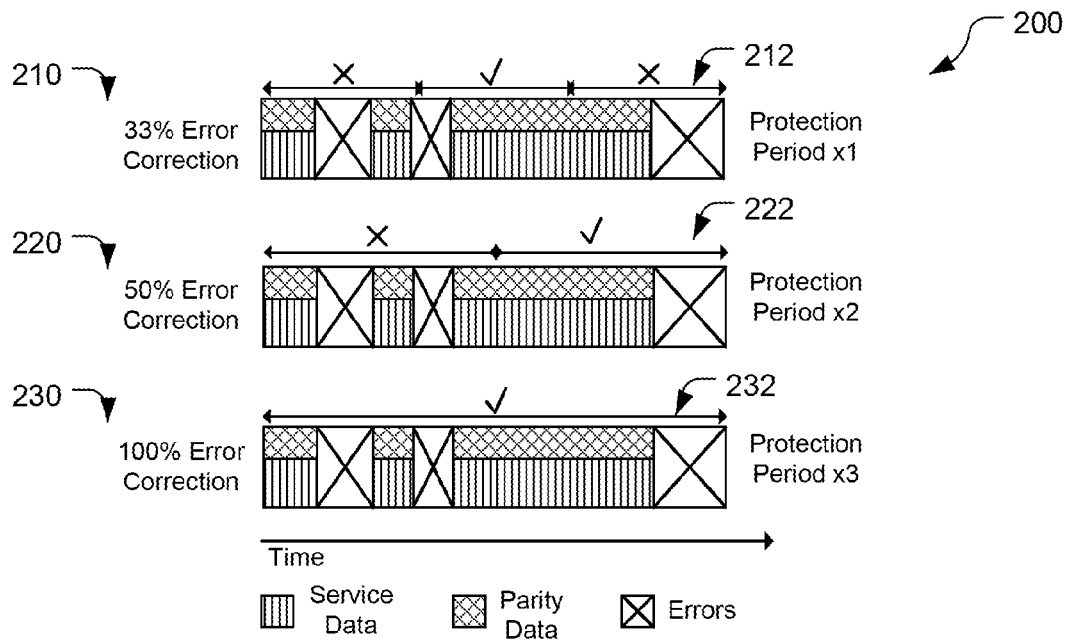
FIG. 2 is an illustration of the impact of protection periods on error correction capabilities of example FEC mechanisms.

The level of protection provided by FEC mechanisms depends on the code rate and the protection period. The code rate is the proportion of source data with respect to the total amount of information transmitted, accounting for both source and repair data. The protection period is the duration of the information encoded in a source block. Long protection periods take advantage of temporal diversity derived from user mobility and achieve better protection in the presence of shadowing. FIG. 2 is an illustration 200 of the impact of protection periods on error correction capabilities of example FEC mechanisms. A same error pattern is represented for three configurations with a same amount of repair data but with different protection periods. Assuming that each protection period corresponds to one source block, the information has been encoded in three source blocks 212 in the first case 210, encoded in two source blocks 222 in the second case 220, and encoded in one source block 232 in the third case 230. In the first case 210, only the source block 212 containing the shortest error burst can be decoded, which corresponds to 33% error correction. In the second case 220, one source block 222 can be decoded, which corresponds to 50% error correction. In the third case 230, the protection period extends to the entire transmission, and the service will be recovered without any losses, which corresponds to 100% error correction. An increase in the protection period, however, only improves the reception if the amount of repair data is enough to correct the lost information. Otherwise, an increase in the protection period may even degrade the overall symbol loss rate.

The protection period affects not only the level of protection provided by the FEC mechanism but also network latency and, more importantly, receiver latency or channel switching time. The network latency is the amount of time that passes from the instant the information enters the transmitter until the instant it is delivered to media decoders in the receiver. The channel switching time is the amount of time between the instant when a user switches to a new channel and the instant when the new content is displayed to the user. Although network latency is not critical for the majority of services, the channel switching time is considered a critical criterion in mobile television user experience and should not increase beyond certain values. A tradeoff exists between the level of protection that can be offered in mobile reception and the channel switching time that the user experiences as disturbing. Increasing the protection period also affects the memory needed in the receiver, as at least the size of the source data contained in one protection period needs to be stored in order to perform the decoding. However, the use of computationally efficient decoding techniques can reduce the memory problems, and fast channel switching techniques may decrease the channel switching time perceived by the user when long protection periods are used.

AL-FEC Protection of DVB-T Services

The addition of AL-FEC to DVB-T services incorporates FEC protection by making use of erasure codes in a fully backwards-compatible way. In order to achieve this, the video and audio elementary streams should not be altered to allow legacy receivers to continue to extract the video and audio elementary streams of desired services from the received MPEG-2 TS without the need for changes in the legacy receivers. Apart from the repair symbols, some additional information, such as a Source FEC Payload Identifier (ID), is necessary for the decoding process and needs to be passed to the receiver. For associating the source and repair data, a hash sequence of the source data is sent along with the repair data to provide this Source FEC Payload Identifier, such that the source data is unmodified without adding sequence numbering, while FEC-enabled receivers (e.g., the FEC-enabled receiver 140 of FIG. 1) can still associate the source and repair data by producing the same hash sequence. This process is further detailed in Chen. Due to limitations in available hash mechanisms, mainly related to the number of symbols per protection period, each source symbol may need to be encapsulated into several TS packets. The FEC data, including both the repair data and the hash sequences, need to be encapsulated in a manner that ensures that legacy receivers (e.g., the legacy receiver 130 of FIG. 1) drop the TS packets carrying the FEC data without altering the legacy receivers' proper operation.

The MPEG-2 TS specification allows AL-FEC to be incorporated into the protocol stack of DVB-T in a transparent manner above the TS layer. As discussed above, the repair packets can be multiplexed into the MPEG-2 TS as another elementary stream associated with the particular program, and will be discarded by the receivers that do not incorporate AL-FEC. As an example technique to accomplish this, a specific new PID can be assigned to the FEC elementary stream, where the specific new PID is not recognized by legacy receivers. Thus, the new PID assigned to the FEC elementary stream is not recognized by legacy receivers as being associated with an elementary stream of any desired service. As a result, the legacy receivers would discard the FEC elementary stream as if it was a PES of an undesired service. By means of the TEI bit and the CC fields in the TS packet header, it is possible to determine and discard erroneous MPEG-2 TS packets. As the source and repair packets are encapsulated in the MPEG-2 TS packets, the erasure of MPEG-2 TS packets results in a symbol erasure channel. A source or repair symbol is considered erased if at least one of the TS packets carrying information of that particular source or repair symbol is lost. Longer source and repair packets are generally fragmented and encapsulated into multiple TS packets. As one erroneous or lost TS packet is sufficient to erase the entire source or repair packet, this tends to achieve a lower performance, especially in the presence of uncorrelated MPEG-2 TS packet errors.

In this disclosure, systematic raptor codes are considered for AL-FEC in DVB-T services. Raptor codes, described in Shokrollahi, have been previously standardized in DVB systems for the provision of link layer FEC protection. Raptor codes are a computationally efficient implementation of fountain codes that achieve very close to ideal performance (i.e., no additional repair data is required to decode the lost symbols). Fountain codes are a class of erasure codes that can generate a very large amount of parity data from a given source block and thus, are considered rate less (i.e., any amount of FEC overhead can be delivered for any source block size or protection period). Raptor decoding can be implemented in complexity and memory constrained receivers, such as handset receivers, without the need for dedicated hardware due to the code's low computational complexity and efficient memory management. Alternatively, other block-based FEC codes, such as Reed-Solomon or low-density parity-check (LDPC) codes, can be used for protecting the PES packets of the programs being transmitted in a MPEG-2 TS.

Figure 3:
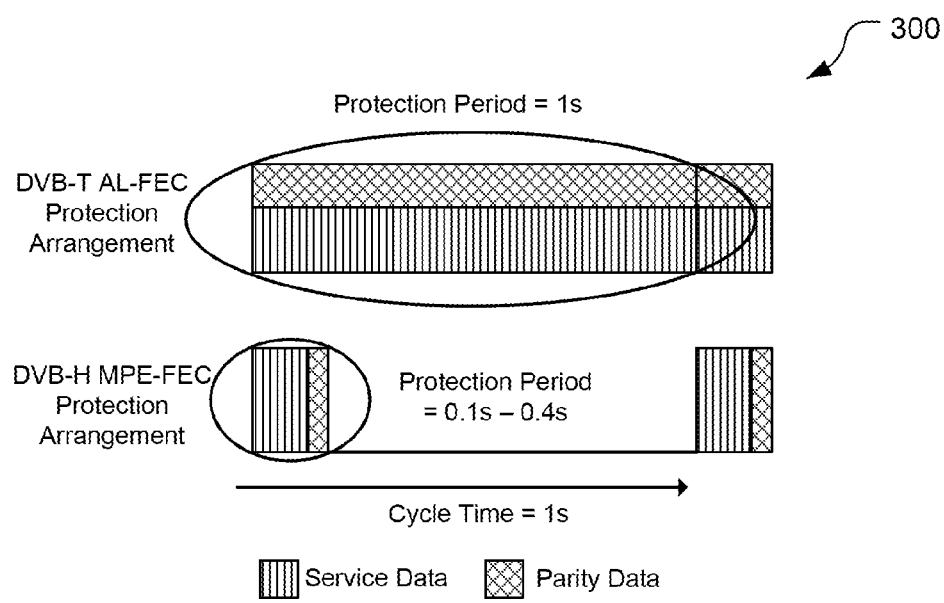
FIG. 3 is an illustration of the protection periods for AL-FEC in DVB-T and for Multi Protocol Encapsulation—Forward Error Correction (MPE-FEC) in Digital Video Broadcasting—Transmission System for Handheld Terminals (DVB-H).

Referring to FIG. 3, an illustration 300 comparing the protection periods for AL-FEC in DVB-T and for MPE-FEC in DVB-H is shown. Because of the time slicing performed in DVB-H, the protection period achieved by MPE-FEC is limited to the burst duration of around 0.1 to 0.4 second. In DVB-H, when a new channel is selected by a user, the receiver needs to wait until the reception of the first burst of the new channel service. Depending on the precise instant of channel switching, the channel switching time can be as high as one cycle time (i.e., the time between bursts) in the worst-case scenario. On the other hand, DVB-T does not perform time slicing, and the services are transmitted continuously over time. The protection period in AL-FEC can be configured up to 10 seconds or more, and is only limited by memory and channel switching time constraints. Although DVB-T does not perform time slicing and thus, the power saving of DVB-H is not possible with DVB-T, the development of more durable batteries has reduced the power consumption issues in handheld terminals. Furthermore, for a significant portion of mobile TV receivers such as netbooks or in-car receivers, battery lifetime is of less relevance.

Another limitation of MPE-FEC that can be overcome by AL-FEC is the dependency between the code rate and the protection period. Due to the nature of Reed Solomon encoding, in order to achieve different code rates other than the mother code rate (e.g., ¾), it is necessary to perform a padding/puncturing mechanism that shortens the burst duration. This is especially important for code rates of ⅔ and ½, for which the burst duration is, respectively, 25% and 50% shorter than in the case of a code rate of ¾. On the contrary, the flexibility of raptor codes allows the proposed AL-FEC implementation to deliver virtually any code rate for a given protection period.

FEC Transmitter

Figure 4:
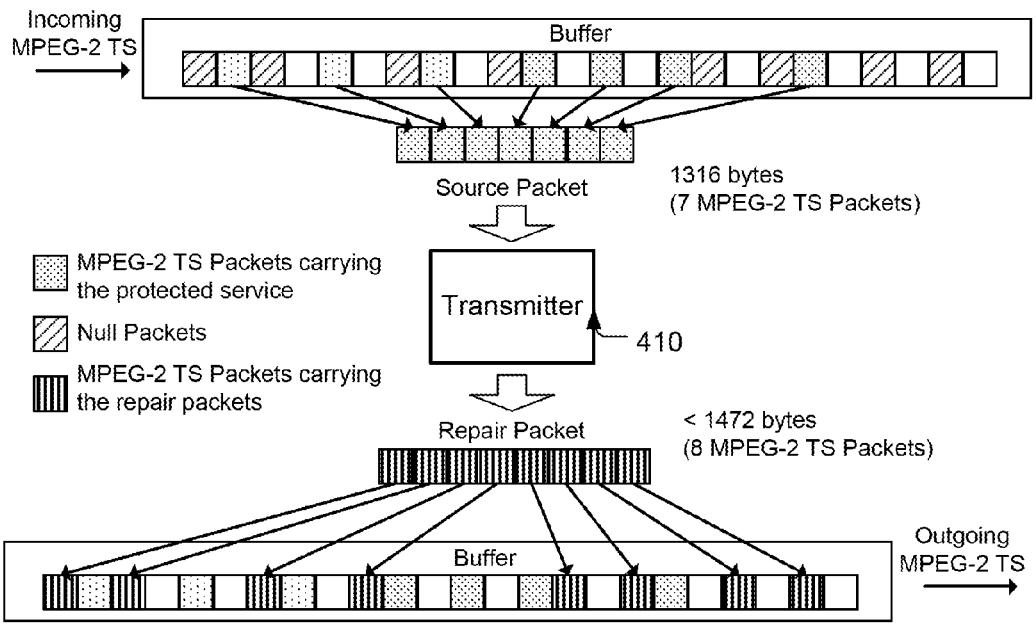
FIG. 4 is an illustration of an FEC transmitter assembling source packets and encapsulating repair packets into a transport stream.

Referring to FIG. 4, an illustration 400 is shown of an FEC transmitter, which assembles source packets and encapsulates repair packets into the MPEG-2 TS. The encoding of the source data can be performed by a transmitter 410, which generates and transmits source identification data for source data, as described in Chen. The FEC transmitter of FIG. 4 differs from the FEC transmitter 110 of FIG. 1 in that the FEC transmitter of FIG. 4 is positioned after the multiplexer 120.

The TS packets carrying the source data, e.g., video and audio information of a particular program, are de-multiplexed from an incoming MPEG-2 TS by the FEC transmitter and assembled into source packets in the same order as the order in which the source data were originally multiplexed. The FEC transmitter sends the source packets to the transmitter 410 and retrieves the source and repair packets. In some implementations, the source packet size is set to 1316 bytes, which corresponds exactly to seven TS packets, each of 188 bytes. Both the header and the payload of the TS packets are FEC protected. To signal a beginning of a source packet to the FEC receiver, a transport priority bit in the MPEG-2 TS packet header can be used. The function of the transport priority bit is to signal the TS packets that need to be processed in the receiver with higher priority. However, as this bit is generally not used in DVB-T transmissions, the bit can be used to signal the beginning of the source packets. For example, an MPEG-2 TS packet can have the transport priority bit set to 1 for each MPEG-2 TS packet that carries the start of a source packet as delivered to the transmitter 410.

In some implementations, the repair packets generated by the transmitter 410 have a variable size ranging from 1320 bytes to 1472 bytes, optimized for operation in Ethernet networks, which corresponds to the payload of 8 TS packets. When the size of the repair packets is not fixed, the size needs to be signaled to the receiver. Two bytes can be inserted at the beginning of the repair packets before encapsulating them into the MPEG-2 TS to signal the repair packet size. If the last MPEG-2 TS packet carrying information of a repair packet is not completely filled with repair data, the rest of the TS packet can be filled with padding.

The FEC transmitter stores the repair packets generated by the transmitter 410 in a circular FIFO during a protection period. The repair packets are then multiplexed in a generally uniform manner over the protection period. The FEC transmitter automatically computes the rate at which the repair packets are encapsulated based on the original service bit-rate and the FEC overhead.

To signal that a null MPEG-2 TS packet is carrying information from a repair packet, the transport priority bit in the MPEG-2 TS packet header can be set to 1. A payload unit start indicator bit in the MPEG-2 TS packet header can be used to signal a beginning of a repair packet to the FEC receiver. Thus, a TS null packet containing repair data would have the payload unit start indicator bit set to 1 if it is the first TS null packet of a repair packet generated by the transmitter 410. The transport priority bit and the payload unit start indicator bit are used by the FEC receiver to assemble the source and repair packets as they were originally assembled in the FEC transmitter. Although the transport priority bit and payload unit start indicator bit are described above for signaling source and repair packets to the FEC receiver, other bit fields in the MPEG-2 TS packet header or other techniques for signaling source or repair packets in MPEG-2 TS packets can also be used.

Alternatively, the FEC transmitter can use a dedicated PID value to signal the transport of repair packets. In this case, the packets carrying the beginning of a repair packet would have their transport priority bit set to 1, as in the case of the source packets. The dedicated PID needs to be set to a value not used in the MPEG-2 TS for carrying an elementary stream or a PSI/SI table, such that legacy receivers would not recognized the dedicated PID and would thus discard the MPEG-2 TS packets that carry repair data. The CC field of the TS packets carrying repair data is increased by 1 with respect to the previous MPEG-2 TS packet carrying repair data. This allows the FEC receiver to identify missing packets that were lost during the transmission of the MPEG-2 TS. The combination of the TEI bit and the CC field can provide reliable detection of lost source and repair packets.

A different option to transport the FEC parity (i.e., repair) data is the generation of a separate FEC MPEG-2 TS stream that could include the FEC data of all programs. Alternatively, the FEC parity data could be distributed over other means, such as another point-to-point network, e.g., Long Term Evolution (LTE) or High Speed Packet Access (HSPA), or another broadcast network, e.g., DVB-H, Digital Video Broadcasting—Satellite services to Handhelds (DVB-SH), MediaFLO, or Multimedia Broadcast and Multicast Services (MBMS).

FEC Receiver

Figure 5:
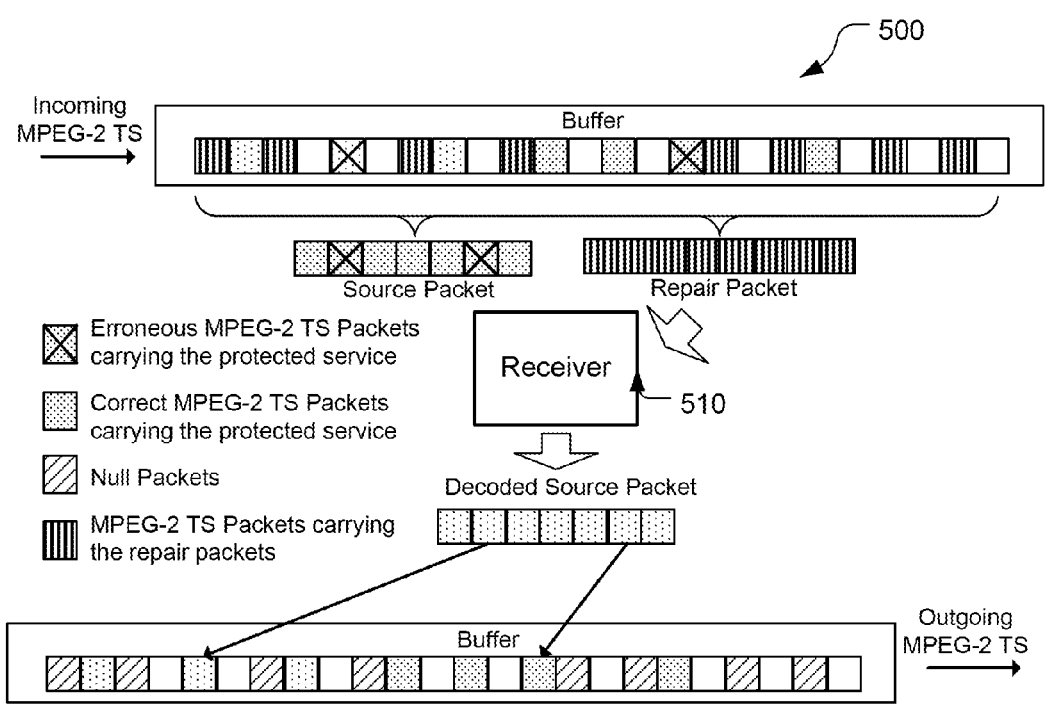
FIG. 5 is an illustration of an FEC receiver separating the source packets and the repair packets from the received transport stream and multiplexing decoded source packets.

Referring to FIG. 5, an illustration 500 is shown of an FEC receiver, which separates the source packets and the repair packets from the received MPEG-2 TS and multiplexes decoded source packets into an outgoing MPEG-2 TS. The decoding of the repair data can be performed by a receiver 510, which receives source identification data and associates the source identification data with source data, as described in Chen. The FEC receiver of FIG. 5 differs from the FEC receiver 146 of FIG. 1 in that the FEC receiver of FIG. 5 is positioned before the de-multiplexer 144 of the FEC-enabled receiver 140.

The source and repair packets are assembled from the received MPEG-2 TS in the same order as they are received. The transport priority bit indicates to the FEC receiver the beginning of a new source or repair packet. The TEI bit and the CC field in the header of the TS packets are used to identify erroneous or missing packets. One missing or erroneous MPEG-2 TS packet invalidates the source or repair packet to which the TS packet belongs. Erroneous, and possibly incomplete, source or repair packets can be automatically discarded and not passed to a receiver 510. The FEC receiver overwrites the erroneously received TS packets as null TS packets to free bandwidth for the decoded packets that will be multiplexed.

The FEC receiver sends the correctly received source and repair packets to the receiver 510 and retrieves the decoded source packets. The decoded source packets retrieved from the receiver 510 are stored in a circular FIFO during the protection period before being multiplexed into the outgoing MPEG-2 TS. The decoded packets are multiplexed into the outgoing MPEG-2 TS in the locations that are occupied by null TS packets in the received stream.

The instantaneous bit rate of the decoded service needs to be maintained to achieve the strict timing model of MPEG-2 TS. The correctly received TS packets pertaining to the FEC-enabled service can be used to synchronize the multiplexing of the decoded packets. The decoded packets are multiplexed by filling gaps between correctly received TS packets, which maintains the original bit rate at which the packets were originally multiplexed. As only the erroneously received TS packets are erased, there is no loss in the service quality when the source blocks cannot be decoded.

Configuration of Protection Amount and Protection Period

In AL-FEC, the protection amount (i.e., the FEC overhead) is the percentage of repair data transmitted relative to the original data. The protection period (i.e., the duration period) applied by AL-FEC is determined by the duration of the information contained in one source block. The channel switching time and memory constraints directly depend on the size of the protection period, as all the information of one source block needs to be stored before being decoded. For AL-FEC protection of DVB-T Services, both the protection amount and the protection period are configurable.

As the FEC repair data generated from encoding is transmitted in the same MPEG-2 TS as the video and audio information, the efficiency of the FEC protection (low overhead) is of very important. Preferably, the lowest overhead FEC codes that achieve the desired performance are used. The bandwidth to deliver this additional FEC data within an MPEG-2 TS can be obtained, for example, by protecting the perceptually most important data or the most important programs only, using non-occupied capacity in DVB-T, replacement of null packets in the MPEG-2 TS with FEC data, reducing the video and/or audio bit rate by improved video encoding schemes, or increasing the coding rate and bandwidth efficiency on the physical layer and, therefore, changing the available bit rate.

The information to be protected can be selected on an elementary stream basis or on a per service basis, such that the configuration can be adapted to the characteristics and constraints of each transmitted service. Information such as Teletext, captioning, or supplementary data can be left without protection to maximize the efficiency of the FEC protection for the more important data. For a protected service, not all the PESs corresponding to that service need be protected by FEC. In one example, to improve the efficiency of FEC protection of a television program, only the most important information, e.g. the video information and only one audio track, can be encoded.

As another example, consider a video stream encoded according to the MPEG standard, with three types of frames: Intra (I) frames or key-frames, which do not reference any other frames; Predictive (P) frames, which can reference I- and P-frames presented in the past; and Bidirectional (B) frames, which can reference the I- and P-frames presented both in the past and in the future. FEC protection can be limited to the I- and P-frames, but not the B-frames, to maximize the use of available bandwidth for the highest priority data elements.

In addition to protection amount, i.e., FEC overhead, the protection period is also configurable with AL-FEC protection of DVB-T services. Unlike MPE-FEC, the protection period of AL-FEC in DVB-T is only constrained by memory, delay, and channel switching time considerations. Therefore, AL-FEC can be applied to cope with shadowing as well as fast fading. Moreover, the continuous transmission and the higher bit rate of DVB-T services compared to DVB-H allow AL-FEC to achieve an effectively longer protection period than MPE-FEC for the same channel switching time.

In DVB-H, due to the time slicing, a user needs to wait until the reception of the next burst when switching to a new channel. Assuming no other delays, the channel switching time in DVB-H is equal to half a cycle time (i.e., the time between bursts) on average, and equal to one cycle time in the worst-case scenario. On the other hand, the continuous transmission of DVB-T enables almost instantaneous channel switching. If AL-FEC is used in DVB-T, the channel switching time is equal to the protection period. As an example, if the cycle time is 2 seconds in DVB-H and the protection period of AL-FEC is configured to 1 second in DVB-T, the average channel switching time is similar in both systems, whereas the protection period in the case of DVB-T is several times longer (i.e., 1 s for DVB-T versus 100-200 ms for DVB-H). As described above in reference to FIG. 2, the protection provided by an FEC code depends on the protection period.

Process of Protecting Data with AL-FEC

Figure 6:
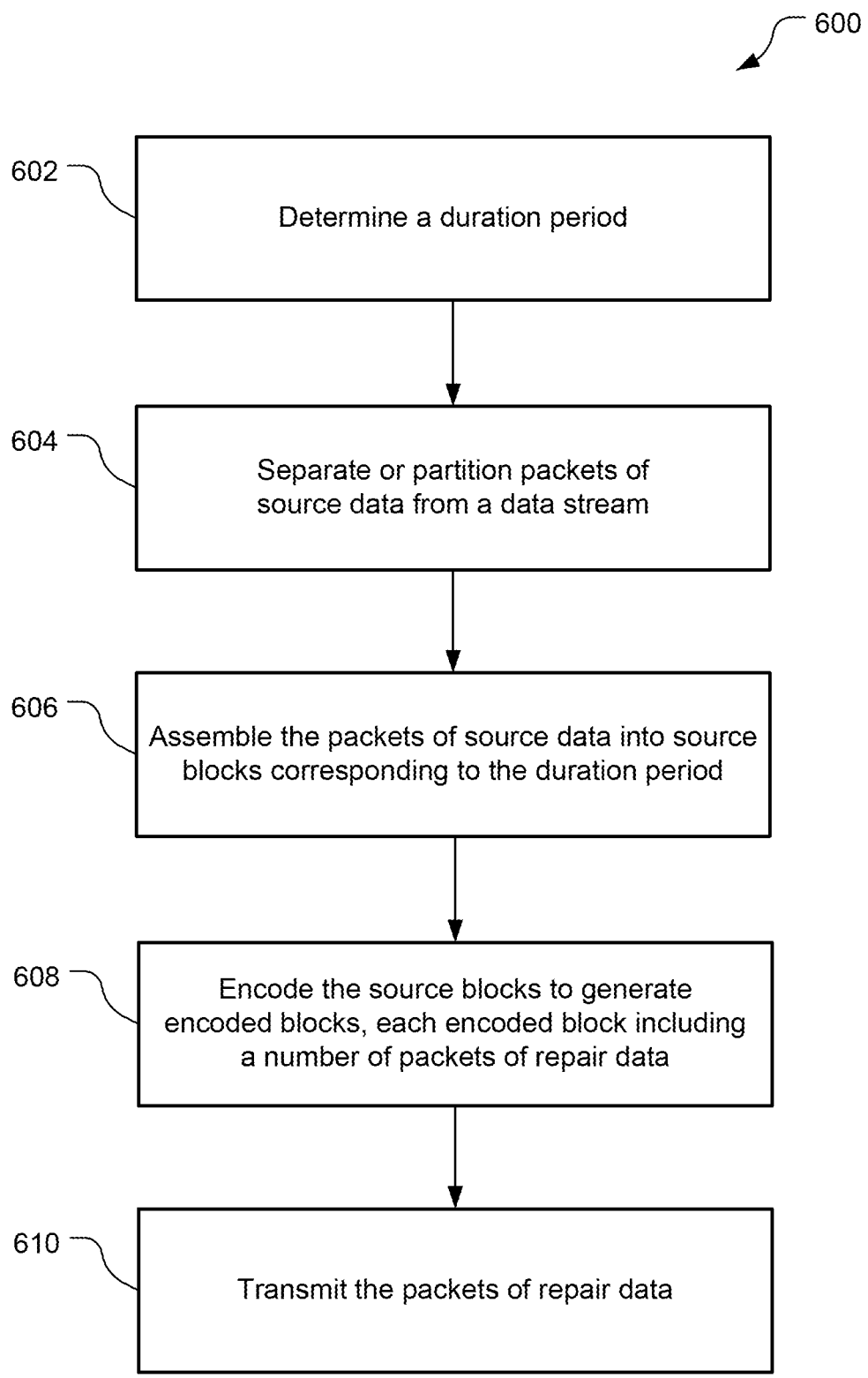
FIG. 6 is a block flow diagram of a process of protecting data with AL-FEC.

Referring to FIG. 6, with further reference to FIGS. 1 and 4, a process 600 of protecting data with AL-FEC in a communication system includes the stages shown. The communication system includes first devices with legacy receivers and second devices with FEC-enabled receivers. Operation of the legacy receivers is not affected by the AL-FEC. The process 600 is, however, exemplary only and not limiting. The process 600 can be altered, e.g., by having stages added, removed, or rearranged.

At stage 602, a processor (e.g., a processor on a source transmitter side of a communication link) determines a duration period. For example, the duration period can be determined to simultaneously achieve a desired level of protection for mobile reception and reduce the channel switching time experienced by a user.

At stage 604, the processor separates or partitions packets of source data from a data stream. For example, a processor of the FEC transmitter 110 of FIG. 1 can partition packets of video data from the video PES. In another example, a processor of the FEC transmitter of FIG. 4 can separate packets of source data from an incoming MPEG-2 TS that includes data multiplexed from multiple services. The data stream can include DVB-T data.

At stage 606, the processor assembles the packets of source data into source blocks corresponding to the duration period, where each source block includes a number of packets of source data. In one example, each source block is a source packet that includes seven MPEG-2 TS packets of source data.

At stage 608, an encoder (e.g., an encoder on the source transmitter side of the communication link) encodes the source blocks to generate encoded blocks, where each encoded block includes a number of packets of repair data. The encoder can be part of the transmitter 410 of FIG. 4, which generates and transmits source identification data for source data, as described in Chen. In one example, each encoded block is a repair packet that can be divided into eight MPEG-2 TS packets of repair data. In some implementations, the number of packets of repair data of an encoded block is greater than the number of packets of source data of a source block.

At stage 610, a transmitter transmits the packets of repair data. For example, the packets of repair data can be encapsulated in an FEC elementary stream and multiplexed with other elementary streams by the multiplexer 120 of FIG. 1 before transmitting over the DVB-T network. In another example, the FEC transmitter of FIG. 4 can multiplex the packets of repair data with packets of data from other elementary streams in an outgoing MPEG-2 TS.

In some implementations, which packets of source data from the data stream to assemble into source blocks is determined, where at least some of the packets of source data from the data stream are not assembled into source blocks. For example, a processor can determine that only the most important packets of source data are to be assembled into source blocks for encoding. In some implementations, the processor determines a protection amount for the source blocks, where the encoding of source blocks is based on the protection amount. For example, the protection amount can be determined to simultaneously achieve a desired level of protection for mobile reception and reduce the bandwidth needed to transmit the repair data.

Process of Receiving Data Protected with AL-FEC

Figure 7:
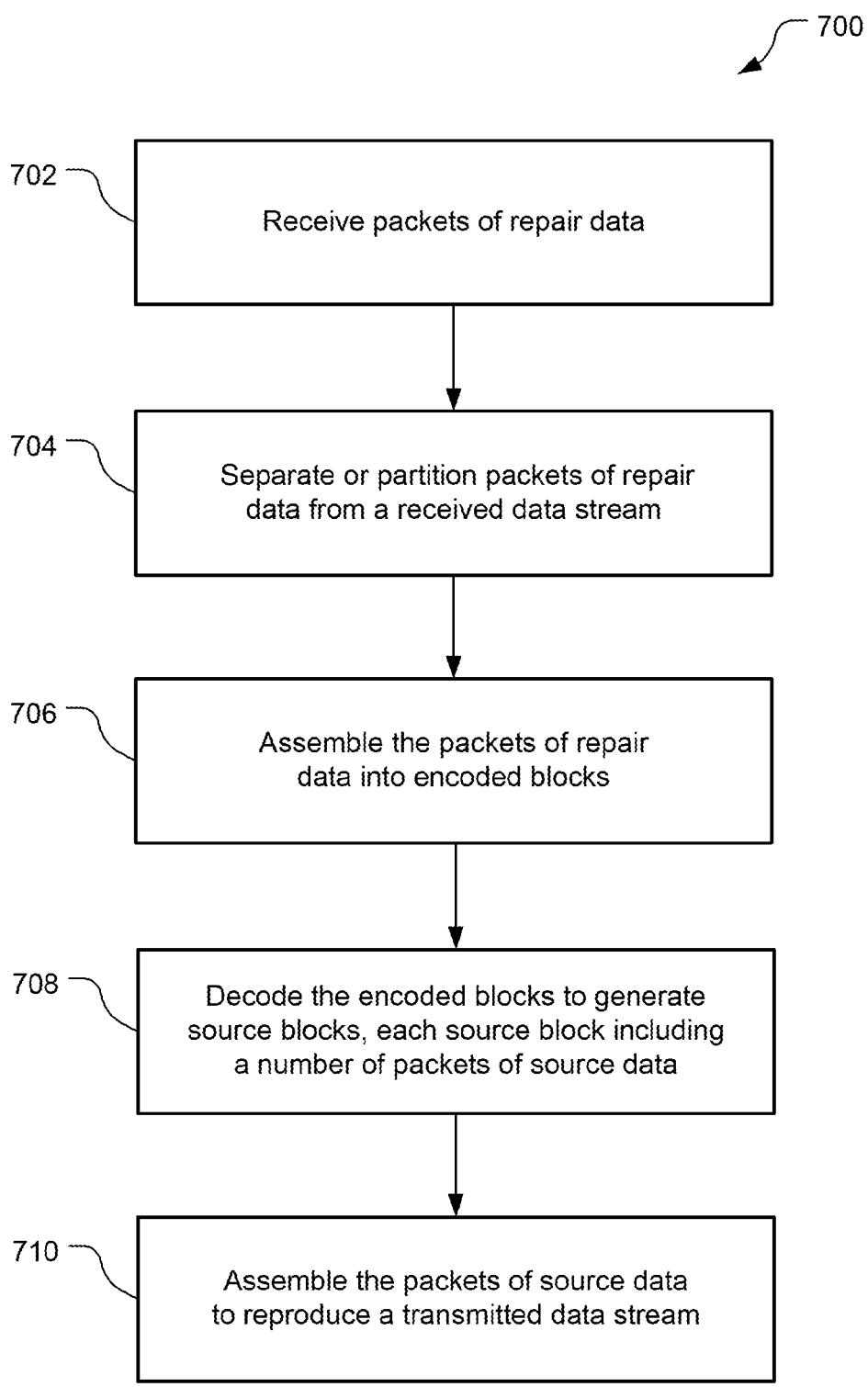
FIG. 7 is a block flow diagram of a process of receiving data with AL-FEC.

Referring to FIG. 7, with further reference to FIGS. 1 and 5, a process 700 of receiving data protected with AL-FEC in a communication system includes the stages shown. The communication system includes first devices with legacy receivers and second devices with FEC-enabled receivers. Operation of the legacy receivers is not affected by the AL-FEC. The process 700 is, however, exemplary only and not limiting. The process 700 can be altered, e.g., by having stages added, removed, or rearranged.

At stage 702, a receiver receives packets of repair data. For example, the DVB-T receiver 142 of the FEC-enabled receiver 140 of FIG. 1 can receive the packets of repair data. In another example, the FEC receiver of FIG. 5 can receive the packets of repair data.

At stage 704, a processor (e.g., a processor on a receiver side of a communication link) separates or partitions the packets of repair data from a received data stream. For example, the packets of repair data can be de-multiplexed from a received MPEG-2 TS by the de-multiplexer 144 of the FEC-enabled receiver 140 of FIG. 1 and encapsulated in an FEC elementary stream. The packets of repair data can then be partitioned from the FEC elementary stream. In another example, a processor of the FEC receiver of FIG. 5 can separate the packets of repair data from an incoming MPEG-2 TS, which includes received packets of data from multiple services. The received data stream can include DVB-T data.

At stage 706, the processor assembles the received packets of repair data into encoded blocks, where each encoded block includes a number of packets of repair data. In one example, each encoded block is a repair packet assembled from eight received MPEG-2 TS packets of repair data.

At stage 708, a decoder (e.g., a decoder on the receiver side of the communication link) decodes the encoded blocks to generate source blocks, where each source block corresponds to a predetermined duration period and includes a number of packets of source data. The decoder can be part of the receiver 510 of FIG. 5, which receives source identification data and associates the source identification data with source data, as described in Chen. In one example, each source block generated by the decoder is a corrected source packet that can be divided into seven MPEG-2 TS packets of corrected source data. In some implementations, the number of packets of repair data of an encoded block is greater than the number of packets of source data of a source block. In some implementations, the encoded blocks are decoded based on a predetermined protection amount.

At stage 710, the processor assembles the packets of source data to reproduce a transmitted data stream. For example, a processor of the FEC receiver 146 of FIG. 1 can assemble the packets of corrected source data to reproduce the transmitted video PES. In another example, a processor of the FEC receiver of FIG. 4 can assemble the packets of corrected source data with received data from multiple services into an outgoing MPEG-2 TS that reproduces the transmitted MPEG-2 TS of FIG. 4.

Performance Evaluation of AL-FEC Protection of DVB-T Services

Simulations were performed assuming a DVB-T physical layer configuration of fast Fourier transform (FFT) equal to 8K, a guard interval equal to ¼, 16 quadrature amplitude modulation (QAM), and a coding rate equal to ½. The transmission mode employed gives a total bit rate of approximately 9.95 Mbps. For the evaluation of AL-FEC in DVB-T services, a service of 2.5 Mbps is protected by an ideal FEC implementation. The size of the source and repair symbol is configured to 184 bytes, which corresponds to the payload of one TS packet, and therefore, each symbol was directly mapped to one MPEG-2 TS packet. For simplicity, it was assumed that no signaling overhead (e.g., hash sequences) is needed to perform the decoding, i.e., all the FEC overhead was dedicated to transmission of repair data. These assumptions correspond to an upper limit on the performance, but the expected deviation from real implementations was marginal. An ideal erasure code was also assumed for encoding/decoding, i.e., the source blocks could be decoded successfully without any additional FEC symbol overhead.

The mobile performance was evaluated by means of TU6 laboratory measurements. The laboratory measurement setup consisted of a DVB-T modulator, a signal generator for emulating the TU6 channel model, and a DVB-T measurement system capable of recording the error data at the TS layer. By recording the error data at the TS layer, it was possible to emulate the performance of upper layers by means of link layer simulations. The measurements were obtained for a transmission mode configured as above in a range of carrier-to-noise ratio (CNR) values from 0 to 30 dB and for Doppler values of 10 Hz and 80 Hz.

Packet Error Ratio (PER) was used as the metric to measure the performance of AL-FEC. The PER is the percentage of packets in which there is at least one error. In the case of AL-FEC simulated, a packet corresponded to a source packet. A PER value of 1% was the quality of service criterion.

Figure 8:
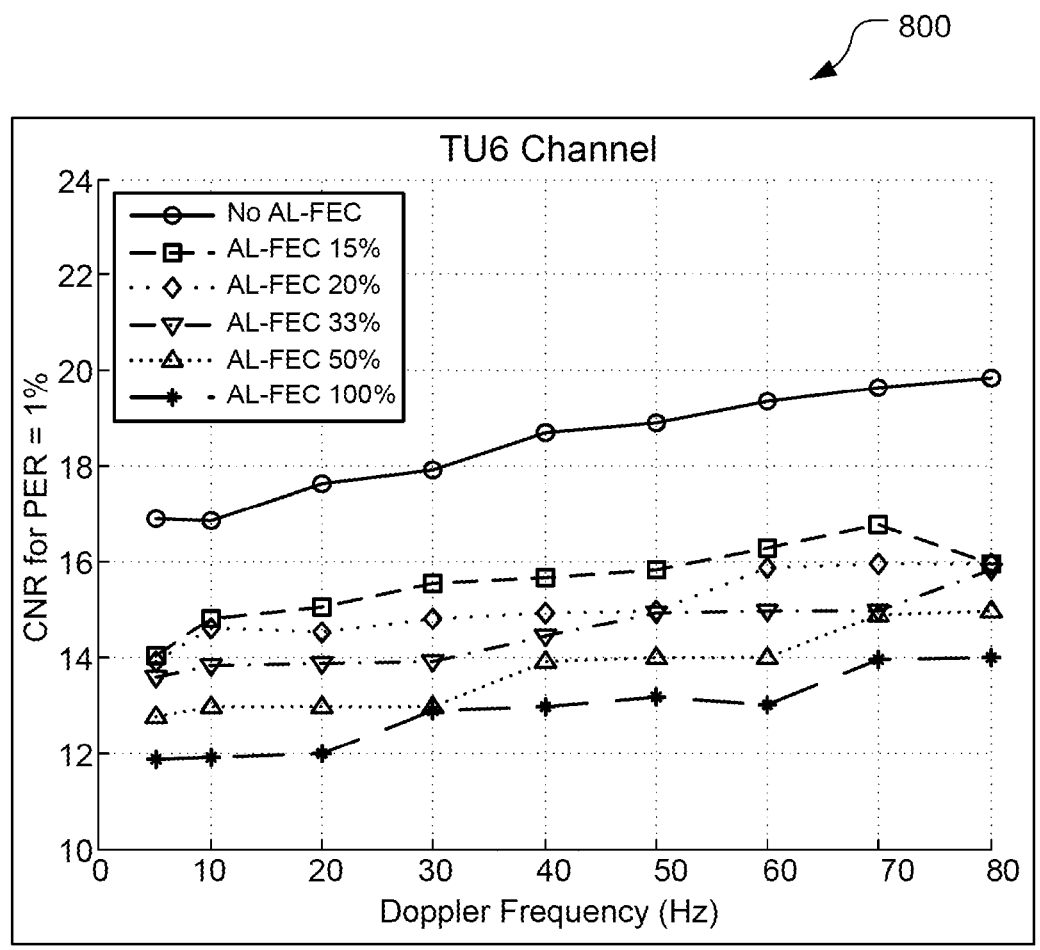
FIG. 8 is a plot of mobile performance of simulated DVB-T services with AL-FEC in a TU6 channel.

Referring to FIG. 8, a plot 800 of the mobile performance of the simulated DVB-T services with AL-FEC in the TU6 channel is shown. The AL-FEC was configured to a protection period of 1 second. The AL-FEC is configured with protection amounts (i.e., FEC overhead) of 0%, 15%, 20%, 33%, 50%, and 100%.

FIG. 8 illustrates that when AL-FEC is enabled, the performance of DVB-T increases considerably, achieving important gains in terms of CNR threshold. The gain obtained by AL-FEC is up to 5 dB in the lower range of Doppler and up to 6 dB in the higher range. The AL-FEC is configured with a protection period of 1 second that is independent of the FEC overhead. The errors caused by low Doppler shifts tend to be grouped in longer error bursts. Longer protection periods can cope with this kind of error distribution more effectively than protection periods of shorter duration. The loss between 10 Hz and 80 Hz is about 2 dB for all the FEC overheads evaluated.

Figure 9:
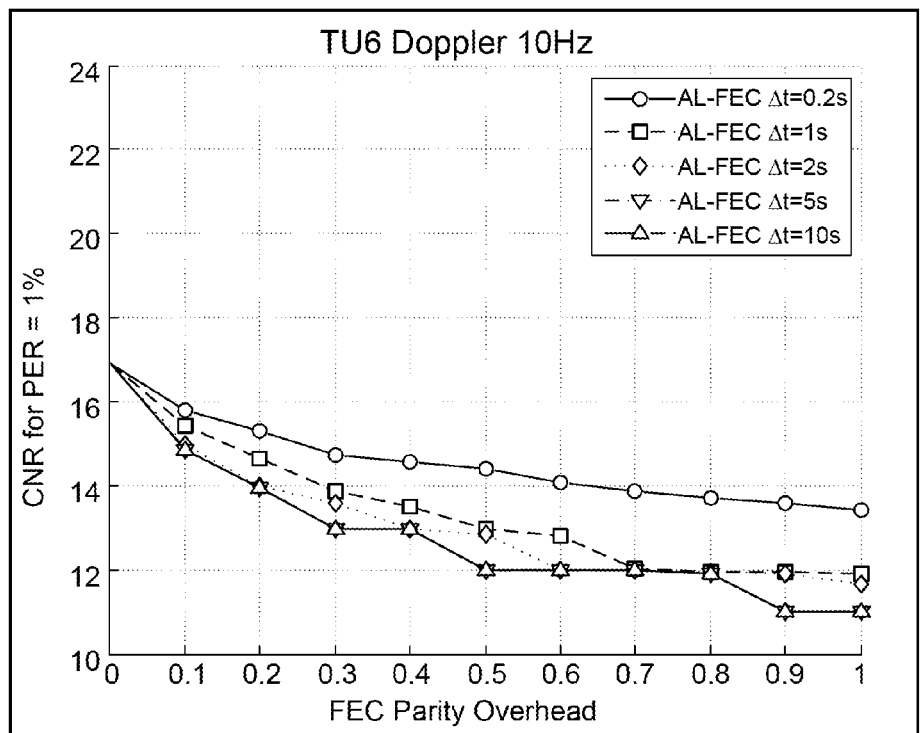
FIG. 9 is a plot of mobile performance of simulated DVB-T services with AL-FEC in a TU6 channel configured with 10 Hz of Doppler.
Figure 10:
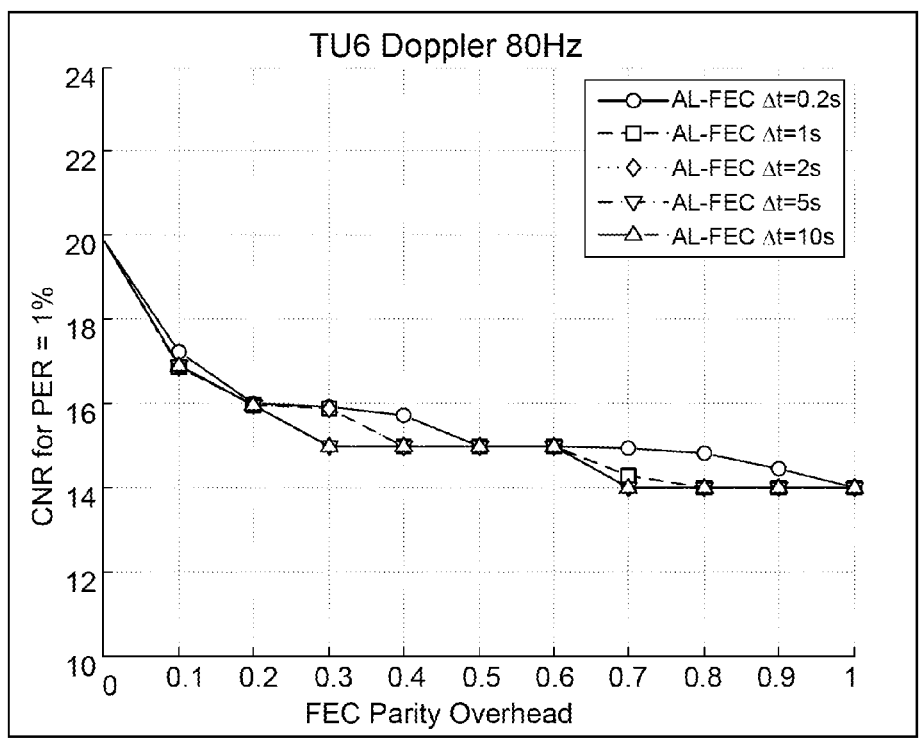
FIG. 10 is a plot of mobile performance of simulated DVB-T services with AL-FEC in a TU6 channel configured with 80 Hz of Doppler.

Referring to FIGS. 9 and 10, plots 900 and 1000 of the mobile performance of the simulated DVB-T services with AL-FEC in the TU6 channel configured with 10 Hz and 80 Hz of Doppler, respectively, are shown. FIGS. 9 and 10 illustrate the effects of FEC repair overhead (i.e., the protection amount) and protection period for an ideal implementation of AL-FEC.

In FIG. 10, 0.2 seconds of protection period are enough to repair the errors caused by fast fading at the high Doppler value of 80 Hz. In this case, the difference between a protection period of 0.2 and 10 seconds is only slightly above 1 dB. In the case of the low Doppler value of FIG. 9, a protection period of 1 second can improve the reception by 1 dB with respect to a protection period of 0.2 seconds. Protection periods higher than 2 seconds bring little to no advantage to combat fast fading.

Additional simulation results showing AL-FEC protection of DVB-T services in the presence of shadowing and comparing AL-FEC protection of DVB-T services with MPE-FEC protection of DVB-H services are described in "Mobile Reception of DVB-T Services by Means of AL-FEC Protection," by David Gozálvez, et al., published May 13-15, 2009 in the proceedings of the IEEE International Symposium on Broadband Multimedia Systems and Broadcasting, 2009.

Network Planning

Network planning issues arise with the addition of AL-FEC protection of DVB-T services. While fixed reception is generally performed with high gain antennas located on the roof of buildings, mobile reception is characterized by reception at ground level and use of low gain antennas. The degradation in performance due to the height loss and the use of mobile antennas can affect the link budget of DVB-T systems, especially in urban scenarios. For DVB-T networks planned for fixed reception, the AL-FEC protection of DVB-T services or the use of antenna diversity techniques can generally provide mobile reception in areas with the best coverage conditions but cannot provide mobile reception with coverage levels comparable to those of fixed DTT services. On the other hand, DVB-T networks planned for portable reception take into account the penalization due to height loss and lower gain antennas. The combined gain of AL-FEC and antenna diversity techniques (for use at the transmitter and/or the receiver) can be used in DVB-T networks deployed for portable reception to provide mobile DVB-T services with similar coverage area to that of fixed DVB-T services.

One possibility to partially counteract the more demanding reception of mobile services in terrestrial networks is by means of hierarchical modulation and the new scalable video coding (SVC) video codec. The combined use of hierarchical modes and SVC of H.264/Advanced Video Coding (AVC) presents a high potential for the simultaneous provision of fixed and mobile DVB-T services. The use of the new SVC extension can enhance mobile services by transmitting a base layer and an enhancement layer through two hierarchical streams. Fixed terminals would need to receive both the base and the enhancement layer in order to retrieve the high quality service, whereas mobile terminals only need to receive the base layer. The base layer would not only be transmitted through the more robust stream but also be protected by AL-FEC to ensure its reception by mobile users.

Considerations Regarding the Description

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The blocks of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software executed by a processor, firmware, or any combination thereof. If implemented in software executed by a processor, the functions may be stored on or transmitted over as one or more instructions or code on a computer-readable medium. Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of computer-readable media.

The previous description is provided to enable any person skilled in the art to make and/or use the apparatus, systems, and methods described. Various modifications to the disclosure will be readily apparent to those skilled in the art, and the generic principles defined herein may be applied to other variations without departing from the spirit or scope of the disclosure. Thus, the disclosure is not to be limited to the examples and designs described herein but is to be accorded the widest scope consistent with the principles and novel features disclosed herein.

What is claimed is:

1. A method of protecting data, to be transmitted from a transmitter configured for outputting electronic signals, with application layer forward error correction ("FEC") in a communication system, the communication system including first devices with legacy receivers and second devices with FEC-enabled receivers, wherein operation of the legacy receivers is not affected by the application layer FEC, the method comprising:
   determining a duration period;
   assembling packets of source data into source blocks corresponding to the duration period, each source block comprising a number of packets of source data;
   encoding the source blocks, using an encoder, to generate encoded blocks, each encoded block comprising a number of packets of repair data forming application layer FEC data;
   parsing the source blocks into a first set of elementary streams comprising one or more elementary streams having associated elementary stream indicators:
   parsing the encoded blocks into a second set of elementary streams comprising one or more elementary streams having associated elementary stream indicators: and
   transmitting the packets of repair data, using the transmitter, with elementary stream indicators, including indicators that an FEC-enabled receiver recognizes as an FEC stream and a legacy receiver recognizes as a stream to be ignored, thereby allowing for a transmission directed at both FEC-enabled receivers and legacy receivers to be handled such that operation of the legacy receivers is not affected by the application layer FEC.

2. The method of claim 1, wherein the source data comprises Digital Video Broadcasting—Terrestrial data.

3. The method of claim 1, further comprising separating or partitioning the packets of source data from a data stream.

4. The method of claim 1, wherein the number of packets of repair data of an encoded block is greater than the number of packets of source data of a source block.

5. The method of claim 1, further comprising determining which packets of source data from a data stream to assemble into source blocks, wherein at least some of the packets of source data from the data stream are not assembled into source blocks.

6. The method of claim 1, further comprising determining a protection amount for the source blocks, wherein the source blocks are encoded based on the protection amount.

7. A method of receiving data, with a receiver configured for receiving and processing electronic signals, protected with application layer forward error correction ("FEC") in a communication system, the communication system including first devices with legacy receivers and second devices with FEC-enabled receivers, wherein operation of the legacy receivers is not affected by the application layer FEC, the method comprising:
   receiving packets of repair data using the receiver;
   if packets are received and determined to be associated with an elementary stream not handled by the receiver, skipping such packets;
   if packets are received and determined to be associated with an elementary stream indicated as containing packets of repair data providing application layer FEC data and the receiver is configured as an FEC-enabled receiver, processing the packets determined to be FEC data;

parsing packets from an elementary stream when packets are determined to be associated with the elementary stream and the elementary stream is indicated as containing source blocks, to form encoded blocks;

if the receiver is configured as an FEC-enabled receiver, assembling the received packets of repair data into additional encoded blocks, each additional encoded block comprising a number of packets of repair data;

decoding the encoded blocks using a decoder to generate source blocks, each source block corresponding to a predetermined duration period and comprising a number of packets of source data;

if the receiver is configured as an FEC-enabled receiver and not all source data is decoded, using the additional encoded blocks to generate additional source data; and assembling the packets of source data, and the additional source data, if available, to reproduce a transmitted data stream.

8. The method of claim 7, wherein the transmitted data stream comprises Digital Video Broadcasting—Terrestrial data.

9. The method of claim 7, further comprising separating or partitioning the packets of repair data from a received data stream.

10. The method of claim 7, wherein the encoded blocks are decoded based on a predetermined protection amount.

11. An apparatus configured to protect data with application layer forward error correction ("FEC") in a communication system, the communication system including first devices with legacy receivers and second devices with FEC-enabled receivers, wherein operation of the legacy receivers is not affected by the application layer FEC, the apparatus comprising:

a processor configured to determine a duration period, and assemble packets of source data into source blocks corresponding to the duration period, each source block comprising a number of packets of source data;

an encoder communicatively coupled to the processor and configured to encode the source blocks to generate encoded blocks, each encoded block comprising a number of packets of application layer FEC repair data;

a parser for parsing the source blocks into a first set of elementary streams comprising one or more elementary streams having associated elementary stream indicators and for parsing the encoded blocks into a second set of elementary streams comprising one or more elementary streams having associated elementary stream indicators; and a transmitter communicatively coupled to the encoder and configured to transmit the packets of repair data, with elementary stream indicators, including indicators that an FEC enabled receiver recognizes as an FEC stream and a legacy receiver recognizes as a stream to be ignored, thereby allowing for a transmission directed at both FEC-enabled receivers and legacy receivers would be handled such that operation of the legacy receivers is not affected by the application layer FEC.

12. The apparatus of claim 11, wherein the source data comprises Digital Video Broadcasting—Terrestrial data.

13. The apparatus of claim 11, wherein the processor is further configured to separate or partition the packets of source data from a data stream.

14. The apparatus of claim 11, wherein the number of packets of repair data of an encoded block is greater than the number of packets of source data of a source block.

15. The apparatus of claim 11, wherein the processor is further configured to determine which packets of source data from a data stream to assemble into source blocks, wherein at least some of the packets of source data from the data stream are not assembled into source blocks.

16. The apparatus of claim 11, wherein
the processor is further configured to determine a protection amount for the source blocks; and
the encoder is configured to encode the source blocks based on the protection amount.

17. An apparatus configured to receive data protected with application layer forward error correction ("FEC") in a communication system, the communication system including devices with legacy receivers, wherein operation of the legacy receivers is not affected by the application layer FEC, the apparatus comprising:

a receiver configured to receive packets of repair data, wherein packets are received with indications of an associated elementary stream, at least one elementary stream being associated with source packets to be processed by legacy receivers and FEC-enabled receivers and at least one elementary stream being indicated as an elementary stream processed by FEC-enabled receivers and skipped by legacy receivers, to carry the packets of repair data;

an assembly module communicatively coupled to the receiver and configured to assemble the received packets of repair data into encoded blocks, each encoded block comprising a number of packets of repair data; and a decoder communicatively coupled to the assembly module and configured to decode the encoded blocks to generate source blocks, each source block corresponding to a predetermined duration period and comprising a number of packets of source data, wherein the assembly module is further configured to assemble the packets of source data to reproduce a transmitted data stream.

18. The apparatus of claim 17, further comprising a processor communicatively coupled to the receiver and configured to determine that an identifier associated with the repair data corresponds with a desired service.

19. The apparatus of claim 18, wherein
the receiver is configured to receive the packets of repair data as part of a received data stream comprising the packets of repair data, packets of source data of the desired service, and packets of data of other services; and
the apparatus further comprises a de-multiplexer communicatively coupled to the receiver and configured to de-multiplex the packets of repair data and the packets of source data of the desired service from the received data stream.

20. The apparatus of claim 17, wherein the transmitted data stream comprises Digital Video Broadcasting—Terrestrial data.

21. The apparatus of claim 17, wherein the decoder is configured to decode the encoded blocks based on a predetermined protection amount.

22. An apparatus configured to receive data protected with application layer forward error correction ("FEC") in a communication system, the apparatus comprising:

a receiver configured to receive packets of source data of a desired service and packets of repair data for the desired service, wherein the repair data is application layer FEC data and the repair data is for correcting errors in the source data of the desired service, thereby protecting the source data with application layer FEC;
a processor communicatively coupled to the receiver and configured to determine that a first identifier associated with the source data corresponds with the desired service, determine that a second identifier associated with the repair data does not correspond with the desired service, and discard the packets of repair data; and
an assembly module communicatively coupled to the processor and configured to assemble the packets of source data to reproduce a transmitted data stream of the desired service.

23. The apparatus of claim 22, wherein the transmitted data stream comprises Digital Video Broadcasting—Terrestrial data.

24. A non-transitory computer program product for protecting data with application layer forward error correction ("FEC") in a communication system, the communication system including first devices with legacy receivers and second devices with FEC-enabled receivers, wherein operation of the legacy receivers is not affected by the application layer FEC, the non-transitory computer program product comprising:
a non-transitory processor-readable medium storing non-transitory processor-readable instructions configured to cause a processor to:
determine a duration period;
assemble packets of source data into source blocks corresponding to the duration period, each source block comprising a number of packets of source data;
encode the source blocks to generate encoded blocks, each encoded block comprising a number of packets of repair data;
parse the source blocks into a first set of elementary streams comprising one or more elementary streams having associated elementary stream indicators;
parse the encoded blocks into a second set of elementary streams comprising one or more elementary streams having associated elementary stream indicators; and
transmit the packets of repair data, with elementary stream indicators, including indicators that an FEC-enabled receiver recognizes as an FEC stream and a legacy receiver recognizes as a stream to be ignored, thereby allowing for a transmission directed at both FEC-enabled receivers and legacy receivers would be handled such that operation of the legacy receivers is not affected by the application layer FEC.

25. The non-transitory computer program product of claim 24, wherein the source data comprises Digital Video Broadcasting—Terrestrial data.

26. The non-transitory computer program product of claim 24, wherein the non-transitory processor-readable medium is further configured to cause the processor to separate or partition the packets of source data from a data stream.

27. The non-transitory computer program product of claim 24, wherein the number of packets of repair data of an encoded block is greater than the number of packets of source data of a source block.

28. The non-transitory computer program product of claim 24, wherein the non-transitory processor-readable medium is further configured to cause the processor to determine which packets of source data from a data stream to assemble into source blocks, wherein at least some of the packets of source data from the data stream are not assembled into source blocks.

29. The non-transitory computer program product of claim 24, wherein the non-transitory processor-readable medium is further configured to cause the processor to determine a protection amount for the source blocks, wherein the source blocks are encoded based on the protection amount.

30. A non-transitory computer program product for receiving data protected with application layer forward error correction ("FEC") in a communication system, the communication system including first devices with legacy receivers and second devices with FEC-enabled receivers, wherein operation of the legacy receivers is not affected by the application layer FEC, the non-transitory computer program product comprising:
a non-transitory processor-readable medium storing non-transitory processor-readable instructions configured to cause a processor to:
receive packets of repair data, wherein packets are received with indications of an associated elementary stream, at least one elementary stream being associated with source packets to be processed by legacy receivers and FEC-enabled receivers and at least one elementary stream being indicated as an elementary stream processed by FEC-enabled receivers and skipped by legacy receivers, to carry the packets of repair data;
assemble the received packets of repair data into encoded blocks, each encoded block comprising a number of packets of repair data;
decode the encoded blocks to generate source blocks, each source block corresponding to a predetermined duration period and comprising a number of packets of source data; and
assemble the packets of source data to reproduce a transmitted data stream.

31. The non-transitory computer program product of claim 30, wherein the transmitted data stream comprises Digital Video Broadcasting—Terrestrial data.

32. The non-transitory computer program product of claim 30, wherein the non-transitory processor-readable medium is further configured to cause the processor to separate or partition the packets of repair data from a received data stream.

33. The non-transitory computer program product of claim 30, wherein the encoded blocks are decoded based on a predetermined protection amount.

* * * * *